US012628475B2

(12) United States Patent
Basrur et al.

(10) Patent No.: US 12,628,475 B2
(45) Date of Patent: May 12, 2026

(54) DISPLAY DEVICE AND METHOD OF MANUFACTURING THE SAME

(71) Applicant: Samsung Display Co., LTD., Yongin-si (KR)

(72) Inventors: Veidhes Basrur, Yongin-si (KR); Ki Nyeng Kang, Yongin-si (KR); Ock Soo Son, Yongin-si (KR); Jong Hwan Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 368 days.

(21) Appl. No.: 18/339,910

(22) Filed: Jun. 22, 2023

(65) Prior Publication Data

US 2024/0038937 A1 Feb. 1, 2024

(30) Foreign Application Priority Data

Jul. 28, 2022 (KR) ........................ 10-2022-0093756

(51) Int. Cl.
| | |
|---|---|
| *H10H 20/831* | (2025.01) |
| *H01L 25/075* | (2006.01) |
| *H10H 20/857* | (2025.01) |
| *H10H 20/01* | (2025.01) |

(52) U.S. Cl.
CPC ..... *H10H 20/8312* (2025.01); *H01L 25/0753* (2013.01); *H10H 20/857* (2025.01); *H10H 20/032* (2025.01); *H10H 20/0364* (2025.01)

(58) Field of Classification Search
CPC ............. H10H 20/8312; H10H 20/857; H10H 20/032; H10H 20/0364; H01L 25/0753
See application file for complete search history.

(56) References Cited

U.S. PATENT DOCUMENTS

| | | |
|---|---|---|
| 6,531,392 B2 | 3/2003 | Song et al. |
| 7,173,867 B2 | 2/2007 | Terzioglu |

*Primary Examiner* — Samuel A Gebremariam
(74) *Attorney, Agent, or Firm* — Womble Bond Dickinson (US) LLP

(57) ABSTRACT

A display device including a substrate, a first electrode and a second electrode on the substrate, extending parallel to each other along a first direction, and spaced from each other in a second direction intersecting the first direction, a plurality of light emitting elements on the first electrode and the second electrode, a first insulating layer partially covering upper surfaces of the light emitting elements, a first connection electrode on the plurality of light emitting elements and the first insulating layer, the first connection electrode being in contact with an end of each of the plurality of light emitting elements, a second insulating layer on the first connection electrode, a second connection electrode on the second insulating layer, the second connection electrode being in contact with an other end of each of the plurality of light emitting elements, and a first dummy electrode overlapping the first connection electrode.

20 Claims, 28 Drawing Sheets

10

NDA

DPA

DR1
DR2
DR3

CNE: CNE1, CNE2, CNE3, CNE4, CNE5
DE: DE1, DE2, DE3, DE4, DE5, DE6
RME: RME1, RME2

CNE: CNE1, CNE2, CNE3, CNE4, CNE5
DE: DE1, DE2, DE3, DE4, DE5, DE6

PNT: PNT1, PNT2, PNT3, PNT4, PNT5, PNT6

DISPLAY DEVICE AND METHOD OF MANUFACTURING THE SAME

CROSS-REFERENCE TO RELATED APPLICATION

This application claims priority to and the benefit of Korean Patent Application No. 10-2022-0093756, filed on Jul. 28, 2022, in the Korean Intellectual Property Office (KIPO), the entire content of which is incorporated by reference herein.

BACKGROUND

1. Field

One or more embodiments of the present disclosure relate to a display device and a method of manufacturing the same.

2. Description of the Related Art

Display devices are becoming increasingly important with the development of multimedia. Accordingly, various types of display devices such as organic light emitting displays (OLEDs) and liquid crystal displays (LCDs) are being used.

As a device for displaying an image of a display device, there is a self-luminous display device including a light emitting element. The self-luminous display device may be an organic light emitting display using an organic material as a light emitting material in a light emitting element or an inorganic light emitting display using an inorganic material as a light emitting material in a light emitting element.

SUMMARY

Aspects and features of embodiments of the present disclosure provide a display device with reduced visibility of dark spots due to breakage of connection electrodes.

Aspects and features of embodiments of the present disclosure provide a method of manufacturing a display device with reduced visibility of dark spots due to breakage of connection electrodes.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate, a first electrode and a second electrode on the substrate, extending parallel to each other along a first direction, and spaced from each other in a second direction intersecting the first direction, a plurality of light emitting elements on the first electrode and the second electrode, a first insulating layer partially covering upper surfaces of the plurality of light emitting elements, a first connection electrode on the plurality of light emitting elements and the first insulating layer, the first connection electrode being in contact with an end of each of the plurality of light emitting elements, a second insulating layer on the first connection electrode, a second connection electrode on the second insulating layer, and the second connection electrode being in contact with an other end of each of the plurality of light emitting elements, and a first dummy electrode overlapping the first connection electrode in a thickness direction of the substrate.

The first dummy electrode may be at a the same layer as the second connection electrode and may include a same material as the second connection electrode.

The second insulating layer may include a first insulating hole partially exposing an upper surface of the first connection electrode, and the first dummy electrode may be in direct contact with the upper surface of the first connection electrode through the first insulating hole.

The first dummy electrode may be electrically insulated from the second connection electrode.

The first dummy electrode may overlap the plurality of light emitting elements in the thickness direction of the substrate.

The first dummy electrode may be located at an end of the first connection electrode on a first side in the first direction.

The first connection electrode may overlap the first electrode in the thickness direction of the substrate, and the second connection electrode may overlap the second electrode in the thickness direction of the substrate.

The second connection electrode may extend toward a second side in the first direction.

The display device may further include a third connection electrode at a same layer as the first connection electrode and spaced, in the second direction, from a portion of the second connection electrode that extends toward the second side in the first direction.

The portion of the second connection electrode that extends toward the second side in the first direction and the third connection electrode may be in contact with the ends of the plurality of light emitting elements.

The display device may further include a second dummy electrode overlapping, in the thickness direction of the substrate, the portion of the second connection electrode that extends toward the second side in the first direction.

The second dummy electrode may be at the same layer as the first connection electrode, and the second dummy electrode may include a same material as the first connection electrode.

The second dummy electrode may be between the first connection electrode and the third connection electrode in a plan view.

According to one or more embodiments of the present disclosure, there is provided a method of manufacturing a display device, the method includes forming a first electrode and a second electrode on a substrate, the first electrode and the second electrode extending parallel to each other along a first direction and spaced from each other in a second direction intersecting the first direction, forming plurality of light emitting elements on the first electrode and the second electrode, forming a first insulating layer partially covering upper surfaces of the plurality of light emitting elements, forming a first connection electrode on the plurality of light emitting elements and the first insulating layer contacting an end of each of the plurality of light emitting elements, forming a second insulating layer on the first connection electrode, and forming a second connection electrode on the second insulating layer contacting an other end of each of the plurality of light emitting elements. In the forming of the second connection electrode, a first dummy electrode overlapping the first connection electrode in a thickness direction of the substrate is also formed.

The first dummy electrode may be at a same layer as the second connection electrode and includes a same material as the second connection electrode.

3

In the forming of the second insulating layer, the second insulating layer comprises a first insulating hole partially exposing an upper surface of the first connection electrode, and the first dummy electrode may be in direct contact with the upper surface of the first connection electrode through the first insulating hole.

The second connection electrode may extend toward a second side in the first direction in the forming of the second connection electrode, and a third connection electrode at a same layer as the first connection electrode and spaced, in the second direction, from a portion of the second connection electrode that extends toward the second side in the first direction may be in the forming of the first connection electrode.

The portion of the second connection electrode that extends toward the second side in the first direction and the third connection electrode may be in contact with the ends of the plurality of light emitting elements.

In the forming of the first connection electrode, a second dummy electrode overlapping, in the thickness direction of the substrate, the portion of the second connection electrode that extends toward the second side in the first direction and located at a same layer as the first connection electrode may be formed.

The second dummy electrode may be formed between the first connection electrode and the third connection electrode in a plan view.

According to the aforementioned and other embodiments of the present disclosure, the visibility of dart spots due to breakage of connection electrodes can be reduced.

BRIEF DESCRIPTION OF THE DRAWINGS

The above and other features of the present disclosure will become more apparent by describing in detail embodiments thereof, with reference to the accompanying drawings, in which:

FIG. 7 is a cross-sectional view taken along the lines E1-E1', E2-E2', and E3-E3' of FIG. 4;

FIGS. 10 through 22 are cross-sectional views respectively illustrating process steps of a method of manufacturing a display device according to one or more embodiments;

4

Figure 27:
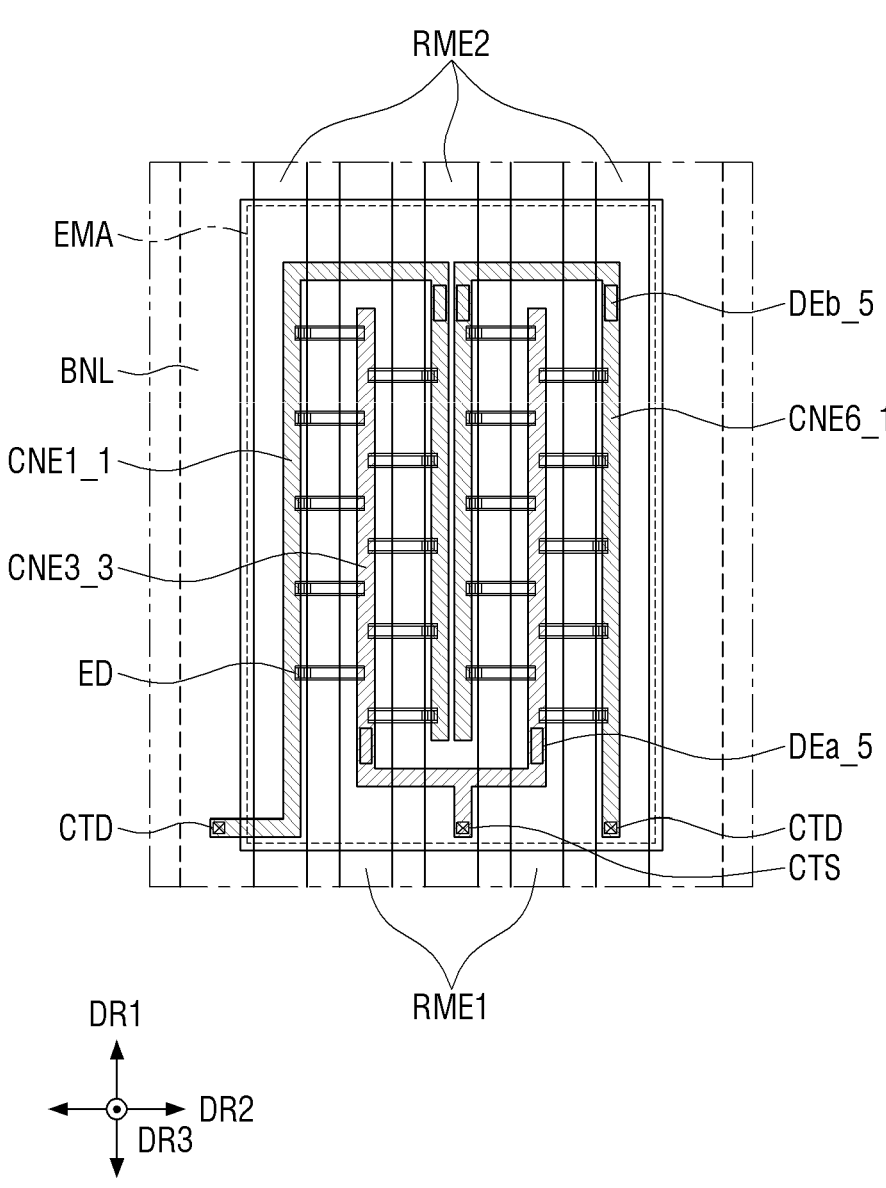

FIG. 27 is a plan view of a subpixel according to one or more embodiments; and

Figure 28:
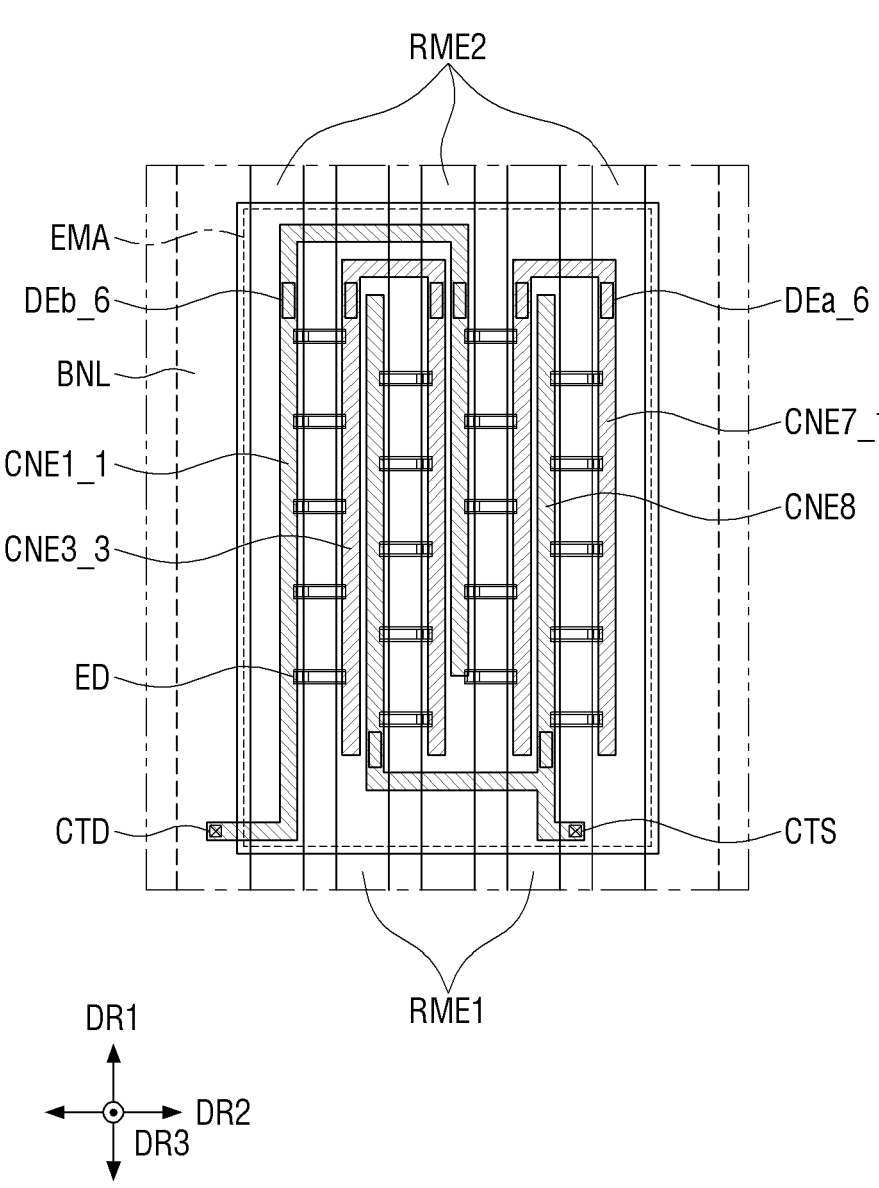

FIG. 28 is a plan view of a subpixel according to one or more embodiments.

DETAILED DESCRIPTION

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that the present disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "in a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," "one of," and "selected from," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B. Further, the use of "may" when describing embodiments of the present disclosure refers to "one or more embodiments of the present disclosure".

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, for example, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning for example consistent with their meaning in the context of the relevant art and/or the present specification, and should not be interpreted in an idealized or overly formal sense, unless expressly so defined herein.

Figure 1:
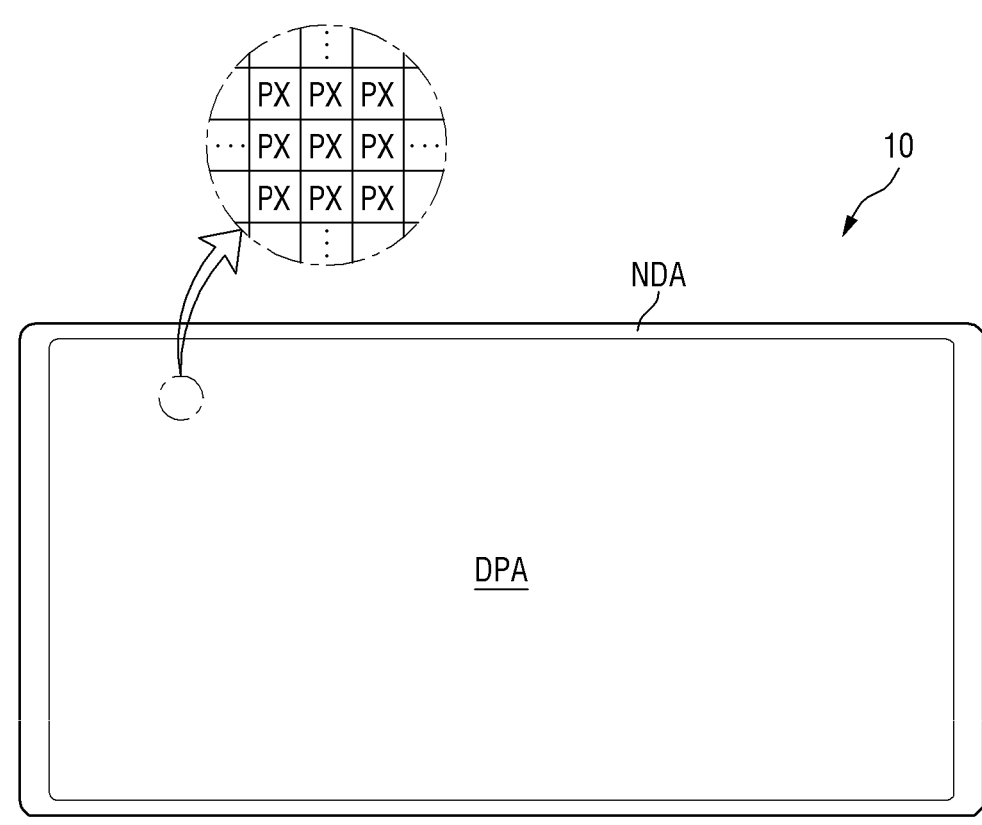
FIG. 1 is a schematic plan view of a display device according to one or more embodiments.
Figure 1:
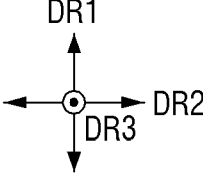

FIG. 1 is a schematic plan view of a display device 10 according to one or more embodiments.

Referring to FIG. 1, the display device 10 displays moving images or still images. The display device 10 may refer to any electronic device that provides a display screen. Examples of the display device 10 may include a television, a laptop computer, a monitor, a billboard, an Internet of things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game console, a digital camera and a camcorder, all of which provide a display screen.

The display device 10 includes a display panel that provides a display screen. Examples of the display panel may include an inorganic light emitting diode display panel, an organic light emitting display panel, a quantum dot light emitting display panel, a plasma display panel, and a field emission display panel. A case where an inorganic light emitting diode display panel is applied as an example of the display panel will be described below, but the present disclosure is not limited to this case, and other display panels can also be applied as long as the same technical spirit is applicable.

The shape of the display device 10 can be variously modified. For example, the display device 10 may have various shapes such as a horizontally long rectangle, a vertically long rectangle, a square, a quadrilateral with rounded corners (vertices), other polygons, or a circle. The shape of a display area DPA of the display device 10 may also be similar to the overall shape of the display device 10. In FIG. 1, the display device 10 shaped like a rectangle that is long in a second direction DR2 is illustrated.

The display device 10 may include the display area DPA and a non-display area NDA. The display area DPA may be an area where an image can be displayed, and the non-display area NDA may be an area where no image is displayed. The display area DPA may also be referred to as an active area, and the non-display area NDA may also be referred to as an inactive area. The display area DPA may generally occupy a center of the display device 10.

The display area DPA may include a plurality of pixels PX. The pixels PX may be arranged in a matrix direction. For example, the pixels PX may be arranged along rows and columns of a matrix. Each of the pixels PX may be rectangular or square in a plan view. However, the present disclosure is not limited thereto, and each of the pixels PX may also have a rhombic planar shape having each side inclined with respect to a direction. The pixels PX may be arranged in a stripe or island type or a PENTILE® structure, or the like. The PENTILE® pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements that emit light of a specific wavelength band to display a specific color.

The non-display area NDA may be located around the display area DPA along an edge or periphery of the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be located, or external devices may be mounted.

Figure 2:
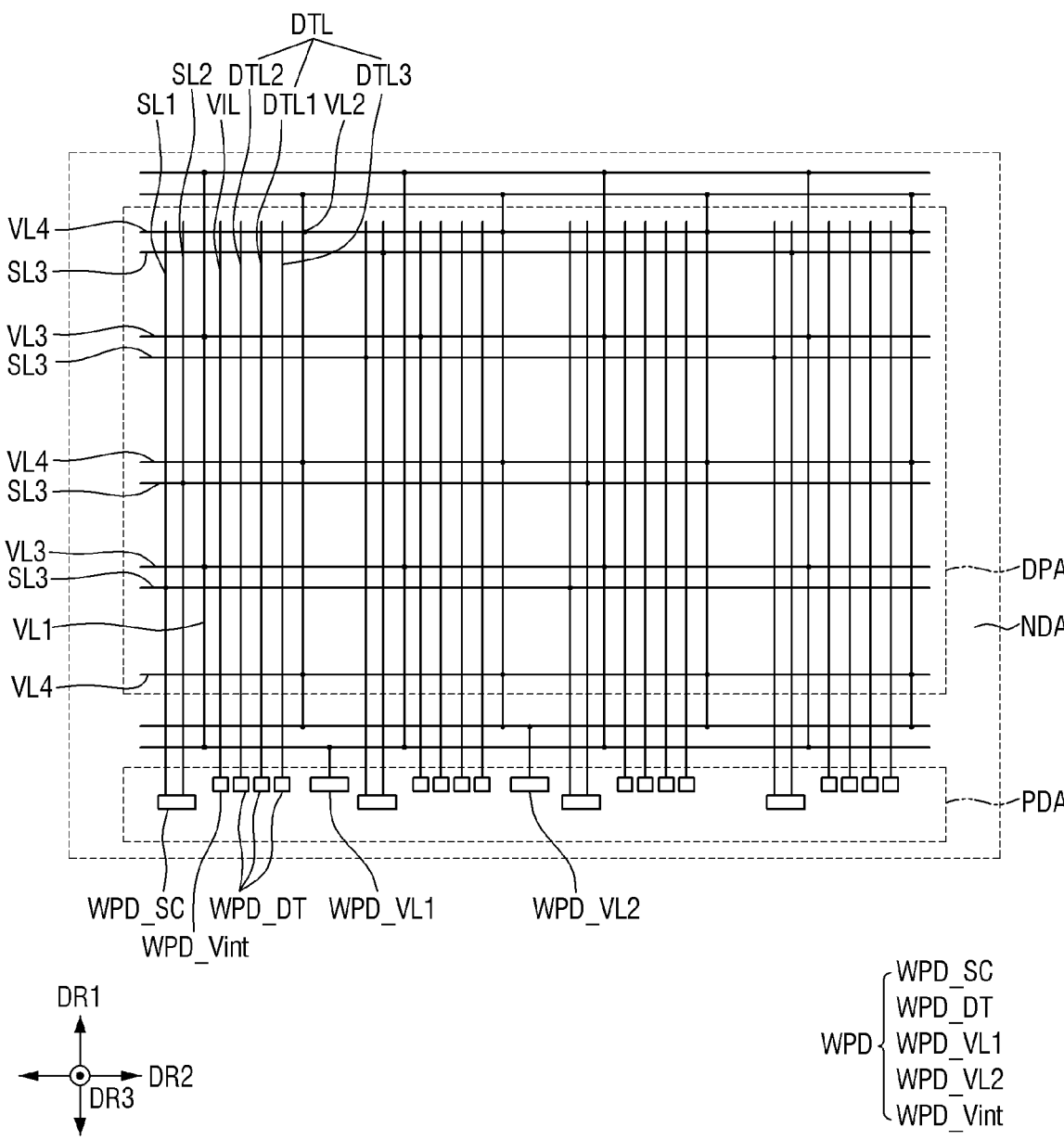
FIG. 2 is a plan view illustrating the arrangement of a plurality of wirings included in the display device according to one or more embodiments.

FIG. 2 is a plan view illustrating the arrangement of a plurality of wirings included in the display device 10 according to one or more embodiments.

Referring to FIG. 2, the display device 10 may include a plurality of wirings. The display device 10 may include a plurality of scan lines SL (SL1 through SL3), a plurality of data lines DTL (DTL1 through DTL3), initialization voltage wirings VIL, and a plurality of voltage wirings VL (VL1 through VL4). In one or more embodiments, other wirings may be further disposed in the display device 10.

First scan lines SL1 and second scan lines SL2 may extend in a first direction DR1. A first scan line SL1 and a second scan line SL2 in one pair may be disposed adjacent to each other and may be spaced from other first scan lines SL1 and other second scan lines SL2 in the second direction DR2. The first and second scan lines SL1 and SL2 may be connected to each scan wiring pad WPD_SC connected to a scan driver. The first scan lines SL1 and the second scan lines SL2 may extend from a pad area PDA disposed in the non-display area NDA to the display area DPA.

Each third scan line SL3 may extend in the second direction DR2 and may be spaced from other third scan lines SL3 in the first direction DR1. One third scan line SL3 may be connected to one or more first scan lines SL1 or one or more second scan lines SL2. In one or more embodiments, the first scan lines SL1 and the second scan lines SL2 may be made of a conductive layer disposed on (or at) a different layer from the third scan lines SL3. The scan lines SL may have a mesh structure in the entire display area DPA, but the present disclosure is not limited thereto.

In the present specification, the term "connect" may mean that any one member and another member are connected to each other not only through physical contact but also through another member. In addition, it can be understood that any one part and another part are connected to each other as one integrated member. Further, the connection between any one member and another member can be interpreted to include electrical connection through another member in addition to connection through direct contact.

The data lines DTL may extend in the first direction DR1. The data lines DTL may include first data lines DTL1, second data lines DTL2, and third data lines DTL3. One of the first data lines DTL1, one of the second data lines DTL2, and one of the third data lines DTL3 may form one group and may be disposed adjacent to each other. The data lines DTL1 through DTL3 may extend from the pad area PDA disposed in the non-display area NDA to the display area DPA. However, the present disclosure is not limited thereto, and the data lines DTL may also be disposed at equal intervals between first and second voltage wirings VL1 and VL2 to be described later.

The initialization voltage wirings VIL may extend in the first direction DR1. Each of the initialization voltage wirings VIL may be disposed between the data lines DTL and the first and second scan lines SL1 and SL2. The initialization voltage wirings VIL may extend from the pad area PDA disposed in the non-display area NDA to the display area DPA.

The first voltage wirings VL1 and the second voltage wirings VL2 extend in the first direction DR1, and third voltage wirings VL3 and fourth voltage wirings VL4 extend in the second direction DR2. The first voltage wirings VL1 and the second voltage wirings VL2 may be alternately disposed along the second direction DR2, and the third voltage wirings VL3 and the fourth voltage wirings VL4 may be alternately disposed along the first direction DR1. The first voltage wirings VL1 and the second voltage wirings VL2 may extend in the first direction DR1 to cross the display area DPA. Among the third voltage wirings VL3 and the fourth voltage wirings VL4, some wirings may be disposed in the display area DPA, and other wirings may be disposed in the non-display area NDA located on both sides of the display area DPA in the first direction DR1. The first voltage wirings VL1 and the second voltage wirings VL2 may be made of a conductive layer disposed on (or at) a different layer from the third voltage wirings VL3 and the fourth voltage wirings VL4. Each of the first voltage wirings VL1 may be connected to at least one third voltage wiring VL3, and each of the second voltage wirings VL2 may be connected to at least one fourth voltage wiring VL4. Therefore, the voltage wirings VL may have a mesh structure in the entire display area DPA. However, the present disclosure is not limited thereto.

The first scan lines SL1, the second scan lines SL2, the data lines DTL, the initialization voltage wirings VIL, the first voltage wirings VL1, and the second voltage wirings VL2 may be electrically connected to at least one wiring pad WPD. Each wiring pad WPD may be disposed in the non-display area NDA. In one or more embodiments, each wiring pad WPD may be disposed in the pad area PDA located on (or at) a lower side of the display area DPA which is a second side in the first direction DR1. The first and second scan lines SL1 and SL2 are connected to each scan wiring pad WPD_SC disposed in the pad area PDA, and the data lines DTL are connected to different data wiring pads WPD_DT, respectively. Each of the initialization voltage wirings VIL is connected to an initialization wiring pad WPD_Vint, the first voltage wirings VL1 are connected to a first voltage wiring pad WPD_VL1, and the second voltage wirings VL2 are connected to a second voltage wiring pad WPD_VL2. An external device may be mounted on the wiring pads WPD. The external device may be mounted on the wiring pads WPD through an anisotropic conductive film, ultrasonic bonding, or the like. Although each wiring pad WPD is disposed in the pad area PDA located on the lower side of the display area DPA in the drawing, the present disclosure is not limited thereto. Some of the wiring pads WPD may also be disposed in an area located on (or at) an upper side or any one selected from among left and right sides of the display area DPA.

Each pixel PX or subpixel SPXn (where n is an integer of 1 to 3) of the display device 10 includes a pixel driving circuit. The above-described wirings may transmit driving signals to each pixel driving circuit while passing through or around each pixel PX. The pixel driving circuit may include a transistor and a capacitor. The number of transistors and capacitors in each pixel driving circuit can be variously changed. According to one or more embodiments, each subpixel SPXn of the display device 10 may have a 3T1C structure in which the pixel driving circuit includes three transistors and one capacitor. Although the pixel driving circuit will be described below using the 3T1C structure as an example, the present disclosure is not limited thereto, and other various modified structures such as a 2T1C structure, a 7T1C structure, and a 6T1C structure are also applicable.

Figure 3:
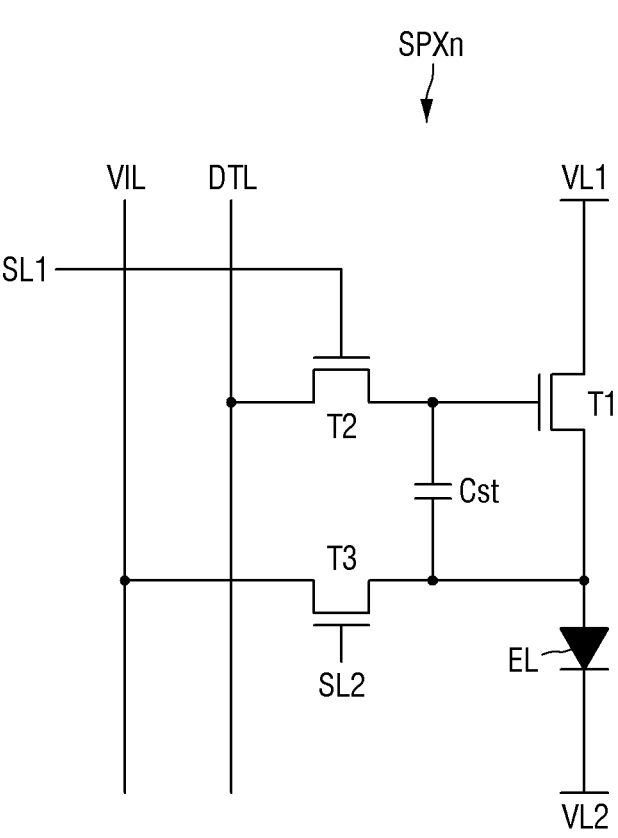
FIG. 3 is an equivalent circuit diagram of a subpixel of the display device according to one or more embodiments.

FIG. 3 is an equivalent circuit diagram of a subpixel SPXn according to one or more embodiments.

Referring to FIG. 3, each subpixel SPXn of the display device 10 according to one or more embodiments includes three transistors T1 through T3 and one storage capacitor Cst in addition to a light emitting diode EL.

The light emitting diode EL emits light according to a current supplied through a first transistor T1 (e.g., a driving transistor). The light emitting diode EL includes a first electrode, a second electrode, and at least one light emitting element disposed between them. The light emitting element may emit light of a specific wavelength band in response to electrical signals received from the first electrode and the second electrode.

A first end of the light emitting diode EL may be connected to a source electrode of the first transistor T1, and a second end of the light emitting diode EL may be connected to a second voltage wiring VL2 to which a low potential voltage (hereinafter, referred to as a second power supply voltage) lower than a high potential voltage (hereinafter, referred to as a first power supply voltage) of a first voltage wiring VL1 is supplied.

The first transistor T1 adjusts a current flowing from the first voltage wiring VL1, to which the first power supply voltage is supplied, to the light emitting diode EL according to a voltage difference between a gate electrode and the source electrode of the first transistor T1. For example, the first transistor T1 may be a driving transistor for driving the light emitting diode EL. The first transistor T1 may have the gate electrode connected to a source electrode of a second transistor T2, the source electrode connected to the first electrode of the light emitting diode EL, and a drain electrode connected to the first voltage wiring VL1 to which the first power supply voltage is applied.

The second transistor T2 (e.g., a switching transistor) is turned on by a scan signal of a first scan line SL1 to connect a data line DTL to the gate electrode of the first transistor T1. The second transistor T2 may have a gate electrode connected to the first scan line SL1, the source electrode connected to the gate electrode of the first transistor T1, and a drain electrode connected to the data line DTL.

A third transistor T3 is turned on by a scan signal of a second scan line SL2 to connect an initialization voltage wiring VIL to the first end of the light emitting diode EL. The third transistor T3 may have a gate electrode connected to the second scan line SL2, a drain electrode connected to the initialization voltage wiring VIL, and a source electrode connected to the first end of the light emitting diode EL or the source electrode of the first transistor T1.

Although the gate electrodes of the second transistor T2 and the third transistor T3 are respectively electrically connected to different scan lines SL1 and SL2 in the drawing, the present disclosure is not limited thereto. In one or more embodiments, the gate electrodes of the second transistor T2 and the third transistor T3 may also be electrically connected to the same scan line.

In one or more embodiments, the source electrode and the drain electrode of each of the transistors T1 through T3 are not limited to the above description, and the opposite may also be the case. In addition, each of the transistors T1 through T3 may be formed as a thin-film transistor. In addition, although each of the transistors T1 through T3 is mainly described as an N-type metal oxide semiconductor field effect transistor (MOSFET) in FIG. 3, the present disclosure is not limited thereto. That is, each of the transistors T1 through T3 may also be formed as a P-type MOSFET, or some of the transistors T1 through T3 may be formed as N-type MOSFETs, and the other may be formed as a P-type MOSFET.

The storage capacitor Cst is formed between the gate electrode and the source electrode of the first transistor T1. The storage capacitor Cst stores a difference between a gate voltage and a source voltage of the first transistor T1.

The structure of a pixel PX of the display device 10 according to one or more embodiments will now be described in detail with further reference to other drawings.

Figure 4:
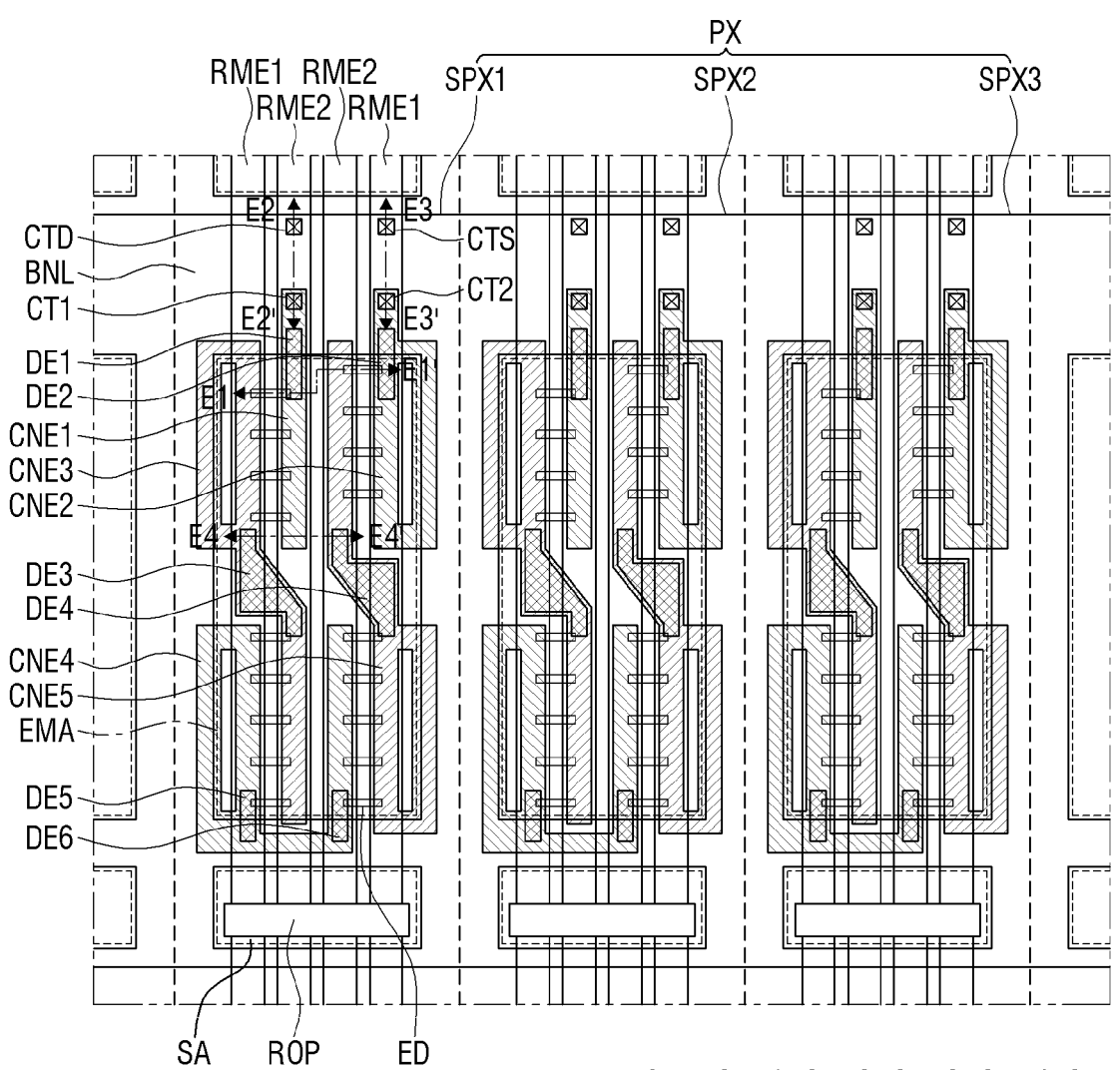
FIG. 4 is a plan view of a pixel of the display device according to one or more embodiments.
Figure 4:
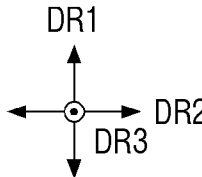

FIG. 4 is a plan view of a pixel PX of the display device 10 according to one or more embodiments. FIG. 4 illustrates the planar arrangement of electrodes RME (RME1 and RME2), bank patterns BP1 through BP3 (e.g., see FIG. 7), a bank layer BNL, a plurality of light emitting elements ED, and connection electrodes CNE (CNE1 through CNE5) in a pixel PX of the display device 10.

Referring to FIG. 4, each pixel PX of the display device 10 may include a plurality of subpixels SPXn. For example, one pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the present disclosure is not limited thereto, and the subpixels SPXn may also emit light of the same color. In one or more embodiments, the subpixels SPXn may emit blue light. Although one pixel PX includes three subpixels SPXn in the drawing, the present disclosure is not limited thereto, and the pixel PX may also include a greater number of subpixels SPXn.

Each subpixel SPXn of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and from which no light is output because light emitted from the light emitting elements ED does not reach this area.

The emission area EMA may include an area in which the light emitting elements ED are disposed and an area which is adjacent to the light emitting elements ED and from which light emitted from the light emitting elements ED is output. For example, the emission area EMA may also include an area from which light emitted from the light emitting elements ED is output after being reflected or refracted by other members. A plurality of light emitting elements ED may be disposed in each subpixel SPXn, and an area where the light emitting elements ED are located and an area adjacent to this area may form the emission area EMA.

Although the respective emission areas EMA of the subpixels SPXn have the same area in the drawing, the present disclosure is not limited thereto. In one or more embodiments, the emission area EMA of each subpixel SPXn may have a different area according to the color or wavelength band of light emitted from the light emitting elements ED disposed in the subpixel SPXn.

Each subpixel SPXn may further include a sub-area SA disposed in the non-emission area. The sub-area SA of each subpixel SPXn may be disposed on a lower side of the emission area EMA which is the second side in the first direction DR1. The emission area EMA and the sub-area SA may be alternately arranged along the first direction DR1, and the sub-area SA may be disposed between the emission areas EMA of different subpixels SPXn spaced from each other in the first direction DR1. For example, the emission area EMA and the sub-area SA may be alternately arranged along the first direction DR1 and may each be repeatedly arranged along the second direction DR2. However, the present disclosure is not limited thereto, and the arrangement of the emission areas EMA and the sub-areas SA in a plurality of pixels PX may also be different from that in FIG. 4.

Light may not exit from the sub-area SA because the light emitting elements ED are not disposed in the sub-area SA, but a portion of each of the electrodes RME disposed in each subpixel SPXn may be disposed in the sub-area SA. The electrodes RME disposed in different subpixels SPXn may be separated from each other by a separation portion ROP of the sub-area SA.

Wirings and circuit elements of a circuit layer disposed in each pixel PX and connected to the light emitting diodes EL may be connected to each of the first through third subpixels SPX1 through SPX3. However, the wirings and the circuit elements are not disposed to correspond to an area occupied by each subpixel SPXn or each emission area EMA but may be disposed regardless of the positions of the emission areas EMA in one pixel PX.

The bank layer BNL may surround the subpixels SPXn, the emission areas EMA, and the sub-areas SA. The bank layer BNL may be disposed at boundaries between the subpixels SPXn adjacent to each other in the first direction DR1 and the second direction DR2 and may also be disposed at boundaries between the emission areas EMA and the sub-areas SA. The subpixels SPXn, the emission areas EMA and the sub-areas SA of the display device 10 may be areas separated by the arrangement of the bank layer BNL. Distances between the subpixels SPXn, the emission areas EMA, and the sub-areas SA may vary according to a width of the bank layer BNL.

The bank layer BNL may include portions extending in the first direction DR1 and the second direction DR2 in a plan view to form a grid pattern in the entire display area DPA. The bank layer BNL may be disposed at the boundary of each subpixel SPXn to separate neighboring subpixels SPXn. In addition, the bank layer BNL may surround the emission area EMA and the sub-area SA disposed in each subpixel SPXn to separate them from each other.

Figure 5:
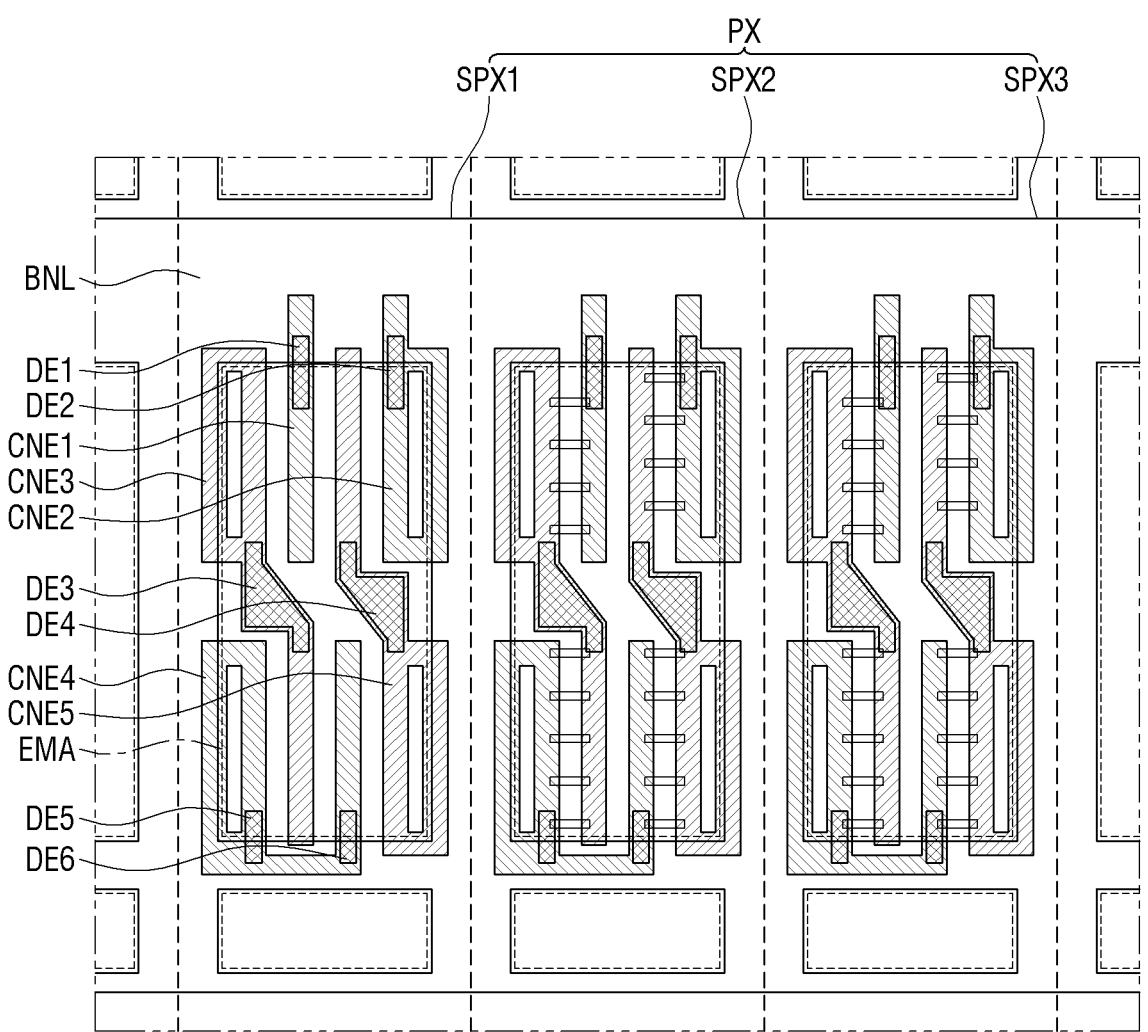
FIG. 5 is a plan view illustrating connection electrodes and dummy electrodes of FIG. 4.
Figure 5:
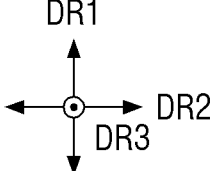
Figure 6:
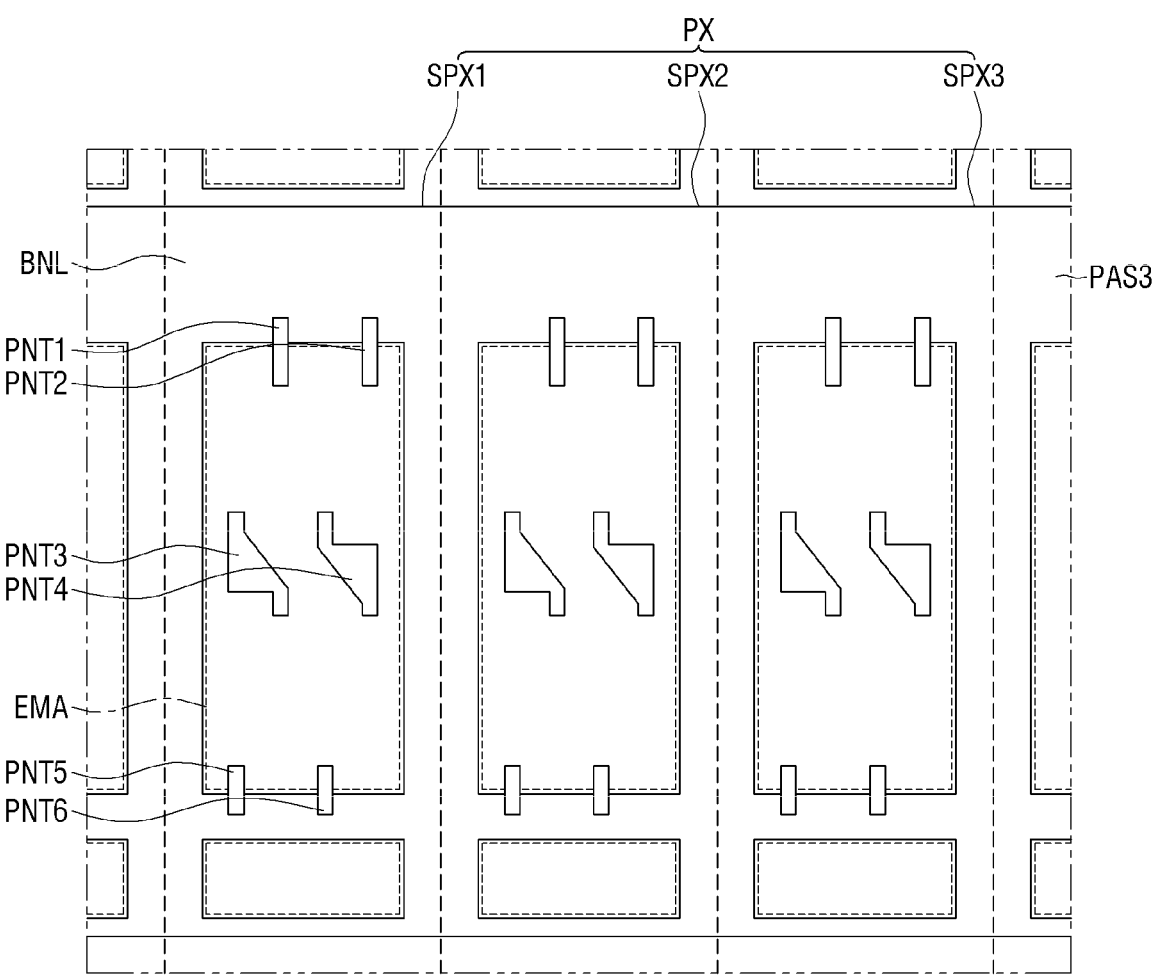
FIG. 6 is a plan view of a third insulating layer of FIG. 4.
Figure 6:
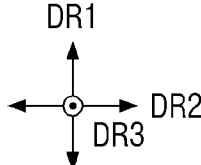
Figure 7:
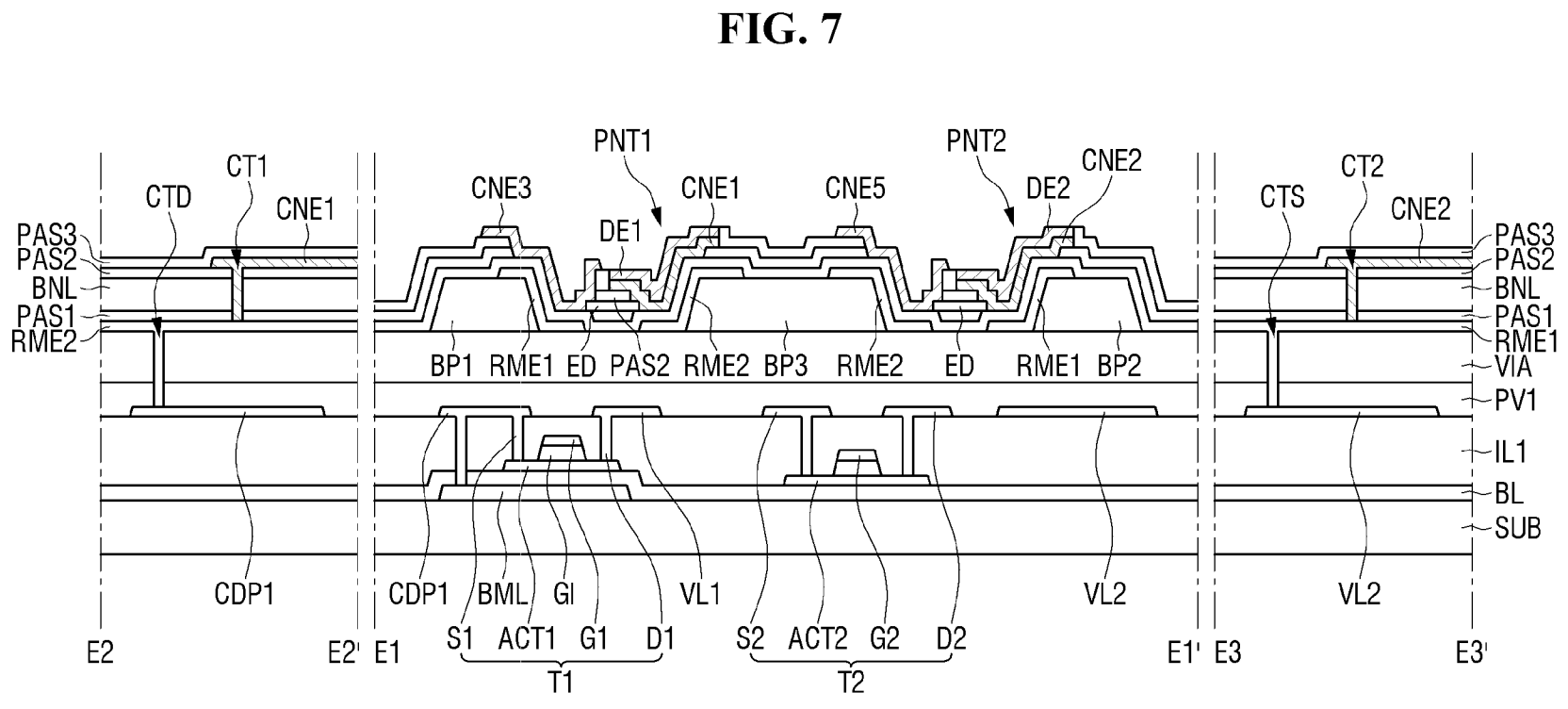
Figure 8:
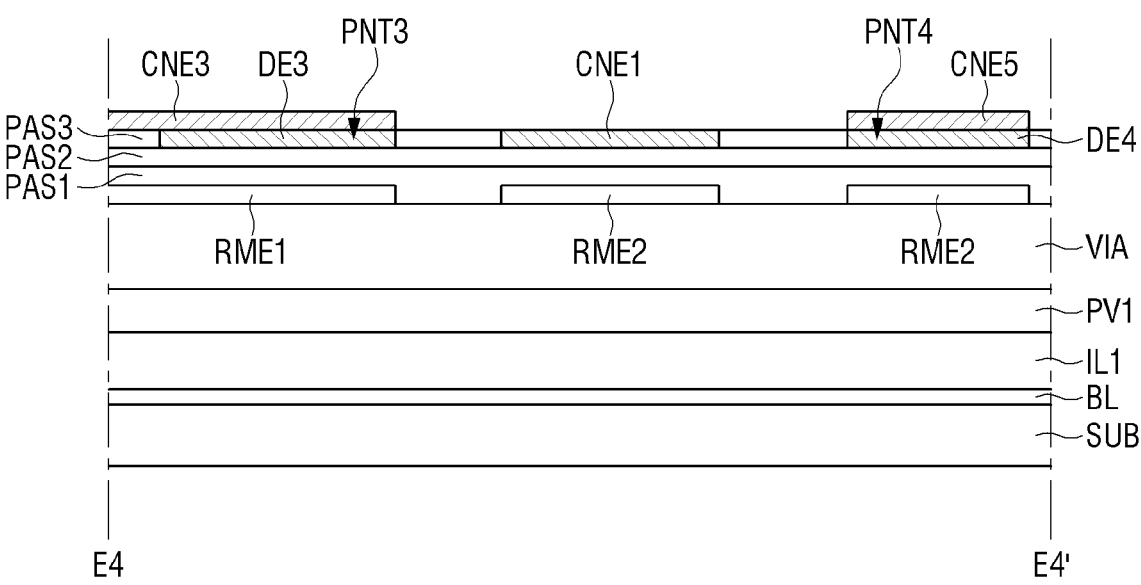
FIG. 8 is a cross-sectional view taken along the line E4-E4' of FIG. 4.

FIG. 5 is a plan view illustrating the connection electrodes CNE and dummy electrodes DE of FIG. 4. FIG. 6 is a plan view of a third insulating layer PAS3 of the subpixels SPXn of FIG. 4. FIG. 7 is a cross-sectional view taken along the lines E1-E1', E2-E2', and E3-E3' of FIG. 4. FIG. 8 is a cross-sectional view taken along the line E4-E4' of FIG. 4.

FIG. 7 illustrates a cross section across both ends of light emitting elements ED and electrode contact holes CTD and CTS disposed in the first subpixel SPX1 and a cross section across contact portions CT1 and CT2.

Referring to FIGS. 5 through 8 in connection with FIG. 4, the display device 10 may include a substrate SUB and a semiconductor layer, a plurality of conductive layers and a plurality of insulating layers disposed on the substrate SUB. In addition, the display device 10 may include the electrodes RME (RME1 and RME2), the light emitting elements ED, and the connection electrodes CNE (CNE1 through CNE5). The semiconductor layer, the conductive layers, and the insulating layers may constitute a circuit layer of the display device 10.

The substrate SUB may be an insulating substrate. The substrate SUB may be made of an insulating material such as glass, quartz, or polymer resin. In addition, the substrate SUB may be a rigid substrate, but may also be a flexible substrate that can be bent, folded, rolled, etc. The substrate SUB may include the display area DPA and the non-display area NDA around the display area DPA, and the display area DPA may include the emission area EMA and the sub-area SA that is a part of the non-emission area.

A first conductive layer may be disposed on the substrate SUB. The first conductive layer includes a bottom metal layer BML, and the bottom metal layer BML is overlapped by an active layer ACT1 of a first transistor T1 in a thickness direction of the substrate SUB. The bottom metal layer BML may prevent incidence of light to the first active layer ACT1 of the first transistor T1 or may be electrically connected to the first active layer ACT1 to stabilize electrical characteristics of the first transistor T1. However, the bottom metal layer BML may also be omitted.

A buffer layer BL may be disposed on the bottom metal layer BML and the substrate SUB. The buffer layer BL may be formed on the substrate SUB to protect transistors of the pixel PX from moisture introduced through the substrate SUB which is vulnerable to moisture penetration and may perform a surface planarization function.

The semiconductor layer is disposed on the buffer layer BL. The semiconductor layer may include the first active layer ACT1 of the first transistor T1 and a second active layer ACT2 of a second transistor T2. The first active layer ACT1 and the second active layer ACT2 may respectively be partially overlapped by a first gate electrode G1 and a second gate electrode G2 of a second conductive layer, which will be described later, in a thickness direction of the substrate SUB.

The semiconductor layer may include polycrystalline silicon, monocrystalline silicon, an oxide semiconductor, or the like. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although the first transistor T1 and the second transistor T2 are disposed in each subpixel SPXn of the display device 10 in the drawings, the present disclosure is not limited thereto, and the display device 10 may include a greater number of transistors.

A first gate insulating layer GI is disposed on the semiconductor layer in the display area DPA. The first gate insulating layer GI may serve as a gate insulating film of each of the transistors T1 and T2. In the drawings, the first gate insulating layer GI is patterned together with the gate electrodes G1 and G2 of the second conductive layer to be described later and thus partially disposed between the second conductive layer and the active layers ACT1 and ACT2 of the semiconductor layer. However, the present disclosure is not limited thereto. In one or more embodiments, the first gate insulating layer GI may be disposed on the entire surface of the semiconductor layer and the buffer layer BL.

The second conductive layer is disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3 which is a thickness direction, and the second gate electrode G2 may overlap a channel region of the second active layer ACT2 in the third direction DR3 which is the thickness direction. In one or more embodiments, the second conductive layer may further include one electrode of a storage capacitor.

A first interlayer insulating layer IL1 is disposed on the second conductive layer. The first interlayer insulating layer IL1 may function as an insulating film between the second conductive layer and other layers disposed on the second conductive layer and may protect the second conductive layer.

A third conductive layer is disposed on the first interlayer insulating layer IL1. The third conductive layer may include a first voltage wiring VL1 and a second voltage wiring VL2 disposed in the display area DPA, a first conductive pattern CDP1, and a source electrode S1 or S2 and a drain electrode D1 or D2 of each of the transistors T1 and T2. In one or more embodiments, the third conductive layer may further include the other electrode of the storage capacitor.

A high potential voltage (or a first power supply voltage) supplied to a second electrode RME2 may be applied to the first voltage wiring VL1, and a low potential voltage (or a second power supply voltage) supplied to a first electrode RME1 may be applied to the second voltage wiring VL2. A portion of the first voltage wiring VL1 may contact the first active layer ACT1 of the first transistor T1 through a contact hole penetrating the first interlayer insulating layer IL1. The first voltage wiring VL1 may serve as a first drain electrode D1 of the first transistor T1. The second voltage wiring VL2 may be directly connected to the first electrode RME1 to be described later.

The first conductive pattern CDP1 may contact the first active layer ACT1 of the first transistor T1 through a contact hole penetrating the first interlayer insulating layer IL1. The first conductive pattern CDP1 may contact the bottom metal layer BML through another contact hole penetrating the first interlayer insulating layer IL1 and the buffer layer BL. The first conductive pattern CDP1 may serve as a first source electrode S1 of the first transistor T1. In addition, the first conductive pattern CDP1 may be connected to the second electrode RME2 or a first connection electrode CNE1 to be described later. The first transistor T1 may transmit the first power supply voltage received from the first voltage wiring VL1 to the second electrode RME2 or the first connection electrode CNE1.

Each of a second source electrode S2 and a second drain electrode D2 may contact the second active layer ACT2 of the second transistor T2 through a contact hole penetrating the first interlayer insulating layer IL1. The second transistor T2 may be any one of the switching transistors described above with reference to FIG. 3. The second transistor T2 may transmit a signal received from the data line DTL of FIG. 3 to the first transistor T1 or transmit a signal received from the initialization voltage wiring VIL of FIG. 3 to the other electrode of the storage capacitor.

A first passivation layer PV1 is disposed on the third conductive layer. The first passivation layer PV1 may function as an insulating film between the third conductive layer and other layers and may protect the third conductive layer.

Each of the buffer layer BL, the first gate insulating layer GI, the first interlayer insulating layer IL1, and the first passivation layer PV1 described above may be composed of a plurality of inorganic layers stacked alternately. For example, each of the buffer layer BL, the first gate insulating layer GI, the first interlayer insulating layer IL1, and the first passivation layer PV1 may be a double layer in which inorganic layers including at least one or more selected from among silicon oxide ($SiO_x$), silicon nitride ($SiN_x$) and silicon oxynitride ($SiO_xN_y$) are stacked or may be a multilayer in which inorganic layers including at least one or more selected from among silicon oxide ($SiO_x$), silicon nitride ($SiN_x$) and silicon oxynitride ($SiO_xN_y$) are alternately stacked. However, the present disclosure is not limited thereto, and each of the buffer layer BL, the first gate insulating layer GI, the first interlayer insulating layer IL1, and the first passivation layer PV1 may also be composed of one inorganic layer including any one of the above insulating materials. In addition, in one or more embodiments, the first interlayer insulating layer IL1 may be made of an organic insulating material such as polyimide (PI).

A via layer VIA is disposed on the first passivation layer PV1 in the display area DPA. The via layer VIA may include an organic insulating material such as polyimide (PI) to compensate for a step difference due to the conductive layers thereunder and form a flat upper surface. However, in one or more embodiments, the via layer VIA may be omitted.

The display device 10 may include, as a display element layer disposed on the via layer VIA, the bank patterns BP1 through BP3, the electrodes RME (RME1 and RME2), the bank layer BNL, the light emitting elements ED, and the connection electrodes CNE (CNE1 through CNE5). In addition, the display device 10 may include insulating layers PAS1 through PAS3 disposed on the via layer VIA.

The bank patterns BP1 through BP3 may be disposed in the emission area EMA of each subpixel SPXn. Each of the bank patterns BP1 through BP3 may have a suitable width (e.g., a predetermined width) in the second direction DR2 and may extend in the first direction DR1.

For example, the bank patterns BP1 through BP3 may include a first bank pattern BP1, a second bank pattern BP2, and a third bank pattern BP3 spaced from each other in the second direction DR2 in the emission area EMA of each subpixel SPXn. The first bank pattern BP1 may be disposed on a left side of a center of the emission area EMA which is a second side in the second direction DR2, the second bank pattern BP2 may be spaced from the first bank pattern BP1 and disposed on a right side of the center of the emission area EMA which is a first side in the second direction DR2, and the third bank pattern BP3 may be disposed between the first bank pattern BP1 and the second bank pattern BP2. Each of the bank patterns BP1 through BP3 may be disposed as an island-shaped pattern in the display area DPA. A plurality of light emitting elements ED may be disposed between the first bank pattern BP1 and the third bank pattern BP3 and between the second bank pattern BP2 and the third bank pattern BP3.

The first bank pattern BP1, the second bank pattern BP2, and the third bank pattern BP3 may have the same width (e.g., substantially same width) in the second direction DR2. However, the present disclosure is not limited thereto, and the first bank pattern BP1, the second bank pattern BP2 and the third bank pattern BP3 may also have different widths. For example, any one bank pattern may have a greater width than the other bank patterns, and the bank pattern having a greater width may be disposed over the emission areas EMA of different subpixels SPXn adjacent to each other in the second direction DR2. Although the bank patterns BP1 and BP2 having the substantially same width are disposed in each subpixel SPXn and the bank pattern BP3 is wider than the bank patterns BP1 and BP2 in the drawings, the present disclosure is not limited thereto. The number and shape of the bank patterns BP1 through BP3 may vary according to the number or arrangement structure of the electrodes RME.

The bank patterns BP1 through BP3 may be disposed on the via layer VIA. For example, the bank patterns BP1 through BP3 may be directly disposed on the via layer VIA, and at least a portion of each of the bank patterns BP1 through BP3 may protrude from the upper surface of the via layer VIA. The protruding portion of each of the bank patterns BP1 through BP3 may have inclined or curved side surfaces, and light emitted from the light emitting elements ED may be reflected by the electrodes RME on the bank patterns BP1 through BP3 to travel toward above the via layer VIA. Unlike in the drawings, the bank patterns BP1 through BP3 may also have an outer surface with a curvature in cross section or may have a semicircular or semielliptical shape. The bank patterns BP1 through BP3 may include, but are not limited to, an organic insulating material such as polyimide (PI).

The electrodes RME (RME1 and RME2) extend in one direction and are disposed in each subpixel SPXn. The electrodes RME1 and RME2 may extend in the first direction DR1 to lie in the emission area EMA and the sub-area SA of each subpixel SPXn and may be spaced from each other in the second direction DR2. The electrodes RME may be electrically connected to the light emitting elements ED to be described later, but the present disclosure is not limited thereto. The electrodes RME may also not be electrically connected to the light emitting elements ED.

The display device 10 may include the first electrode RME1 and the second electrode RME2 disposed in each subpixel SPXn. Each of the first and second electrodes RME1 and RME2 may be provided in plural numbers. The first electrodes RME1 may be disposed on the left side and the right side of the center of the emission area EMA, respectively, and the second electrodes RME2 may be located in the center of the emission area EMA and disposed between the first electrodes RME1.

The first electrodes RME1 may be disposed on the first bank pattern BP1 and the second bank pattern BP2, respectively, and the second electrodes RME2 may be disposed on the third bank pattern BP3. The first electrodes RME1 and the second electrodes RME2 may extend beyond the bank layer BNL to lie in a corresponding subpixel SPXn and a portion of the sub-area SA. The first electrodes RME1 and the second electrodes RME2 of different subpixels SPXn may be spaced from each other by the separation portion ROP located in the sub-area SA of any one subpixel SPXn.

Although four electrodes RME extend in the first direction DR1 in each subpixel SPXn in the drawings, the present disclosure is not limited thereto. For example, in the display device 10, a greater number of the electrodes RME may be disposed in one subpixel SPXn, or the electrodes RME may be partially bent and may have a different width according to position.

Each of the first and second electrodes RME1 and RME2 may be provided in plural numbers. As described above, the second electrodes RME2 may be disposed between the first electrodes RME1. The first electrodes RME1 may be disposed on the first bank pattern BP1 and the second bank pattern BP2, respectively. The first electrodes RME1 may be disposed on the inclined side surfaces of the first bank pattern BP1 and the second bank pattern BP2, respectively.

A distance between the first and second electrodes RME1 and RME2 adjacent to each other in the second direction DR2 may be smaller than a distance between the bank patterns BP1 through BP3 on which the electrodes RME1 and RME2 are disposed. At least a portion of each of the first and second electrodes RME1 and RME2 may be directly disposed on the via layer VIA so that they lie in the same plane.

The light emitting elements ED disposed between the bank patterns BP1 through BP3 may emit light in directions toward both ends thereof, and the emitted light may travel toward the electrodes RME disposed on the bank patterns BP1 through BP3. Each electrode RME may have a structure in which a portion disposed on a bank pattern BP1, BP2, or BP3 can reflect light emitted from the light emitting elements ED. Each of the first and second electrodes RME1 and RME2 may cover at least one side surface of the bank pattern BP1, BP2, or BP3 to reflect light emitted from the light emitting elements ED.

Each electrode RME may directly contact the third conductive layer through an electrode contact hole CTD or CTS in a portion overlapping the bank layer BNL between the emission area EMA and the sub-area SA.

A first electrode contact hole CTD may be formed in an area in which the bank layer BNL and a second electrode RME2 overlap, and a second electrode contact hole CTS may be formed in an area in which the bank layer BNL and a first electrode RME1 overlap. The second electrode RME2 may contact the first conductive pattern CDP1 through the first electrode contact hole CTD penetrating the via layer VIA and the first passivation layer PV1. The first electrode RME1 may contact the second voltage wiring VL2 through the second electrode contact hole CTS penetrating the via layer VIA and the first passivation layer PV1. The second electrode RME2 may be electrically connected to the first transistor T1 through the first conductive pattern CDP1 to receive the first power supply voltage, and the first electrode RME1 may be electrically connected to the second voltage wiring VL2 to receive the second power supply voltage. However, the present disclosure is not limited thereto. In one or more embodiments, the electrodes RME1 and RME2 may not be electrically connected to the voltage wirings VL1 and VL2 of the third conductive layer, and the connection electrodes CNE to be described later may be directly connected to the third conductive layer.

The electrodes RME may include a conductive material having high reflectivity. For example, each of the electrodes RME may include a metal such as silver (Ag), copper (Cu) or aluminum (Al), may be an alloy including aluminum (Al), nickel (Ni) or lanthanum (La), or may have a structure in which a metal layer such as titanium (Ti), molybdenum (Mo) or niobium (Nb) or the above alloy are stacked. In one or more embodiments, each of the electrodes RME may be a double layer or a multilayer in which an alloy including aluminum (Al) and at least one metal layer made of titanium (Ti), molybdenum (Mo) or niobium (Nb) are stacked.

However, the present disclosure is not limited thereto, and each electrode RME may further include a transparent conductive material. For example, each electrode RME may include a material such as ITO, IZO or ITZO. In one or more embodiments, each electrode RME may have a structure in which a transparent conductive material and a metal layer having high reflectivity are each stacked in one or more layers or may be formed as a single layer including them. For example, each electrode RME may have a stacked structure of ITO/Ag/ITO, ITO/Ag/IZO, or ITO/Ag/ITZO/IZO. The electrodes RME may be electrically connected to the light emitting elements ED and may reflect some of the light emitted from the light emitting elements ED in an upward direction above the substrate SUB.

A first insulating layer PAS1 may be disposed in the entire display area DPA and may be disposed on the via layer VIA and the electrodes RME. The first insulating layer PAS1 may include an insulating material to protect the electrodes RME while insulating different electrodes RME from each other. Because the first insulating layer PAS1 covers the electrodes RME before the bank layer BNL is formed, it may prevent the electrodes RME from being damaged in the process of forming the bank layer BNL. In addition, the first insulating layer PAS1 may prevent direct contact of the light emitting elements ED on the first insulating layer PAS1 with other members, and thus, prevent damage to the light emitting elements ED.

In one or more embodiments, the first insulating layer PAS1 may be stepped such that a portion of an upper surface of the first insulating layer PAS1 is depressed between the electrodes RME that are spaced from each other in the second direction DR2. The light emitting elements ED may be disposed on the stepped upper surface of the first insulating layer PAS1, and a space may be formed between the light emitting elements ED and the first insulating layer PAS1.

According to one or more embodiments, the first insulating layer PAS1 may include a plurality of contact portions CT1 and CT2. The first insulating layer PAS1 may include a plurality of contact portions CT1 and CT2 formed in portions in which the connection electrodes CNE to be described later are connected to the electrodes RME. The first insulating layer PAS1 may be disposed on the entire surface of the via layer VIA, but may partially expose layers under the first insulating layer PAS1 in portions in which the contact portions CT1 and CT2 are formed and in a portion in which the separation portion ROP of the sub-area SA is formed.

The contact portions CT1 and CT2 formed in the first insulating layer PAS1 may overlap different electrodes RME, respectively. For example, in one or more embodiments, the contact portions CT1 and CT2 may include a first contact portion CT1 and overlapping a second electrode RME2 and a second contact portion CT2 overlapping a first electrode RME1. Each of the first and second contact portions CT1 and CT2 may penetrate the first insulating layer PAS1 to partially expose an upper surface of the second electrode RME2 or the first electrode RME1 under the contact portion CT1 or CT2. Each of the first and second contact portions CT1 and CT2 may further penetrate some of the other insulating layers disposed on the first insulating layer PAS1. An electrode RME exposed by each of the contact portions CT1 and CT2 may contact a connection electrode CNE.

The bank layer BNL may be disposed on the first insulating layer PAS1. The bank layer BNL may include portions extending in the first direction DR1 and the second direction DR2 and may be around (e.g., may surround) each subpixel SPXn. The bank layer BNL may be around (e.g., may surround) the emission area EMA and the sub-area SA of each subpixel SPXn to separate them and may be around (e.g., may surround) the outermost periphery of the display area DPA to separate the display area DPA and the non-display area NDA. The bank layer BNL may be disposed in the entire display area DPA to form a grid pattern, and areas exposed by the bank layer BNL in the display area DPA may be the emission area EMA and the sub-area SA.

The bank layer BNL may have a height similar to that of the bank patterns BP1 through BP3 and may have a uniform height on the whole. In one or more embodiments, an upper surface of the bank layer BNL may be at a greater height than those of the bank patterns BP1 through BP3, and a thickness of the bank layer BNL may be equal to or greater than those of the bank patterns BP1 through BP3. The bank layer BNL may prevent ink from overflowing to adjacent subpixels SPXn in an inkjet printing process during a manufacturing process of the display device 10. Like the bank patterns BP1 through BP3, the bank layer BNL may include an organic insulating material such as polyimide.

The light emitting elements ED may be disposed in the emission area EMA. The light emitting elements ED may be disposed between the bank patterns BP1 through BP3 and may be spaced from each other in the first direction DR1. In one or more embodiments, the light emitting elements ED may extend in a direction, and both ends of each light emitting element ED may be disposed on different electrodes RME, respectively. A length of each light emitting element ED may be greater than the distance between the electrodes RME that are spaced in the second direction DR2. The direction in which the light emitting elements ED extend may be substantially perpendicular to the first direction DR1 in which the electrodes RME extend. However, the present disclosure is not limited thereto, and the direction in which the light emitting elements ED extend may also be the second direction DR2 or a direction oblique to the second direction DR2.

The light emitting elements ED may be disposed on the first insulating layer PAS1. The light emitting elements ED may extend in a direction, and the direction in which the light emitting elements ED extend may be parallel to an upper surface of the substrate SUB. As will be described later, each light emitting element ED may include a plurality of semiconductor layers disposed along the extending direction, and the semiconductor layers may be sequentially disposed along a direction parallel to the upper surface of the substrate SUB. However, the present disclosure is not limited thereto. When each of the light emitting elements ED has a different structure, the semiconductor layers may be disposed in a direction perpendicular to the substrate SUB.

The light emitting elements ED disposed in the subpixels SPXn may emit light of different wavelength bands depending on the materials that form the semiconductor layers described above. However, the present disclosure is not limited thereto, and the light emitting elements ED disposed in the subpixels SPXn may also emit light of the same color by including the semiconductor layers made of the same material.

The light emitting elements ED may be electrically connected to the electrodes RME and the conductive layers under the via layer VIA by contacting the connection electrodes CNE (CNE1 through CNE5) and may emit light of a specific wavelength band in response to electrical signals.

A second insulating layer PAS2 may be disposed on the light emitting elements ED, the first insulating layer PAS1, and the bank layer BNL. The second insulating layer PAS2 includes a pattern portion extending in the first direction DR1 between the bank patterns BP1 through BP3 and disposed on the light emitting elements ED. The pattern portion may partially cover outer surfaces of the light emitting elements ED and may not cover both sides or both ends of the light emitting elements ED. The pattern portion may form a linear or island-shaped pattern in each subpixel SPXn in a plan view. The pattern portion of the second insulating layer PAS2 may protect the light emitting elements ED while anchoring the light emitting elements ED in the manufacturing process of the display device 10. In addition, the second insulating layer PAS2 may be formed to fill the space between the light emitting elements ED and the first insulating layer PAS1 under the light emitting elements ED. In addition, a portion of the second insulating layer PAS2 may be disposed on the bank layer BNL and in the sub-areas SA.

According to one or more embodiments, the second insulating layer PAS2 may include openings that expose layers under the second insulating layer PAS2 in portions corresponding to the separation portions ROP of the sub-areas SA and in portions exposing first ends and second ends of the light emitting elements ED in the emission areas EMA. In addition, the second insulating layer PAS2 may include a plurality of contact portions CT1 and CT2 formed in portions in which the connection electrodes CNE and the electrodes RME are connected. The second insulating layer PAS2 may be disposed on the entire surface of the first insulating layer PAS1, but may partially expose the layers under the second insulating layer PAS2 in portions in which the openings are formed.

In openings corresponding to the separation portions ROP of the sub-areas SA from among the openings formed in the second insulating layer PAS2, a process of separating the electrodes RME under the openings may be performed. Like the first insulating layer PAS1, the second insulating layer PAS2 may expose the upper surface of the via layer VIA in the separation portions ROP in which the process of separating the electrodes RME is performed.

The connection electrodes CNE (CNE1 through CNE5) may be disposed on the electrodes RME and the bank patterns BP1 through BP3. The connection electrodes CNE may extend in a direction and may be spaced from each other. Each of the connection electrodes CNE may contact the light emitting elements ED and may be electrically connected to the third conductive layer.

The connection electrodes CNE may include the first connection electrode CNE1, a second connection electrode CNE2, a third connection electrode CNE3, a fourth connection electrode CNE4, and a fifth connection electrode CNE5 disposed in each subpixel SPXn.

The first connection electrode CNE1 may extend in the first direction DR1 and may be disposed on a second electrode RME2 or the third bank pattern BP3. The first connection electrode CNE1 may partially overlap the second electrode RME2 and may extend beyond the emission area EMA to the bank layer BNL. The first connection electrode CNE1 may be connected to the second electrode RME2 through the first contact portion CT1. Although the first connection electrode CNE1 and the second electrode RME2 are connected in an example embodiment, the present disclosure is not limited thereto.

The second connection electrode CNE2 may generally have a rectangular shape including an open portion therein in a plan view. That is, the second connection electrode CNE2 may include short sides extending along the second direction DR2 and long sides extending along the first direction DR1, and a corner where each short side meets each long side may be angled or round. A long side of the second connection electrode CNE2 on the second side in the second direction DR2 may extend in the first direction DR1 beyond a short side on a first side in the first direction DR1. A portion of the second connection electrode CNE2 that extends in the first direction DR1 beyond the short side on the first side in the first direction DR1 may be connected to a first electrode RME1 through the second contact portion CT2. Although the portion of the second connection electrode CNE2 that extends in the first direction DR1 beyond the short side on the first side in the first direction DR1 is connected to the first electrode RME1 through the second contact portion CT2 in an example embodiment, the present disclosure is not limited thereto.

The second connection electrode CNE2 may be spaced from the first connection electrode CNE1 in the second direction DR2 and may be located on a side of the first connection electrode CNE1 in the second direction DR2. The second connection electrode CNE2 may be disposed on the first electrode RME1 or the second bank pattern BP2. The second connection electrode CNE2 may partially overlap the first electrode RME1 and may extend beyond the emission area EMA to the bank layer BNL.

The third connection electrode CNE3 may generally have a rectangular shape including an open portion therein in a plan view. That is, the third connection electrode CNE3 may include short sides extending along the second direction DR2 and long sides extending along the first direction DR1, and a corner where each short side meets each long side may be angled or round.

A long side of the third connection electrode CNE3 on the first side in the second direction DR2 may extend beyond a short side on the second side in the first direction DR1. A portion connected to the long side of the third connection electrode CNE3 on the first side in the second direction DR2 and extending beyond the short side on the second side in the first direction DR1 may generally extend along the first direction DR1. However, the portion connected to the long side of the third connection electrode CNE3 on the first side in the second direction DR2 and extending along the first direction DR1 may be bent to extend toward the first side in the second direction DR2 and then may be bent again to extend toward the second side in the first direction DR1.

The third connection electrode CNE3 may be spaced from the first connection electrode CNE1 in the second direction DR2 and may be disposed on the other side of the first connection electrode CNE1 in the second direction DR2.

The third connection electrode CNE3 may be disposed on a first electrode RME1 or the first bank pattern BP1. The portion connected to the long side of the third connection electrode CNE3 on the first side in the second direction DR2 and extending in the first direction DR1 beyond the short side on the second side in the first direction DR1 may be disposed on a second electrode RME2.

The fourth connection electrode CNE4 may generally have a rectangular shape including an open portion therein in a plan view. That is, the fourth connection electrode CNE4 may include short sides extending along the second direction DR2 and long sides extending along the first direction DR1, and a corner where each short side meets each long side may be angled or round.

A short side of the fourth connection electrode CNE4 on the second side in the first direction DR1 may extend in the second direction DR2 beyond a long side on the first side in the second direction DR2 and may be bent to extend toward the second side in the first direction DR1. A portion extending in the second direction DR2 from the short side of the fourth connection electrode CNE4 on the second side in the first direction DR1 beyond the long side on the first side in the second direction DR2 may be located closer to the second side in the first direction DR1 than the portion extending in the first direction DR1 beyond the short side of the third connection electrode CNE3 on the second side in the first direction DR1. A portion connected to the short side of the fourth connection electrode CNE4 on the second side in the first direction DR1 and bent to extend toward the first side in the first direction DR1 from the portion extending in the second direction DR2 beyond the long side on the first side in the second direction DR2 may be disposed between the portion extending in the first direction DR1 beyond the short side of the third connection electrode CNE3 on the second side in the first direction DR1 and the fifth connection electrode CNE5 to be described later in a plan view.

The fourth connection electrode CNE4 may be spaced from the third connection electrode CNE3 in the first direction DR1 and may be disposed on a side of the second connection electrode CNE2 in the first direction DR1.

The fourth connection electrode CNE4 may be disposed on a first electrode RME1 or the first bank pattern BP1. The portion connected to the short side of the fourth connection electrode CNE4 on the second side in the first direction DR1 and bent to extend toward the first side in the first direction DR1 from the portion extending in the second direction DR2 beyond the long side on the first side in the second direction DR2 may be disposed on a second electrode RME2.

The fifth connection electrode CNE5 may generally have a rectangular shape including an open portion therein in a plan view. That is, the fifth connection electrode CNE5 may include short sides extending along the second direction DR2 and long sides extending along the first direction DR1, and a corner where each short side meets each long side may be angled or round.

A long side of the fifth connection electrode CNE5 on the second side in the second direction DR2 may extend beyond a short side on the first side in the first direction DR1. A portion connected to the long side of the fifth connection electrode CNE5 on the second side in the second direction DR2 and extending beyond the short side on the first side in the first direction DR1 may generally extend along the first direction DR1. However, the portion connected to the long side of the fifth connection electrode CNE5 on the second side in the second direction DR2 and extending along the first direction DR1 may be bent to extend toward the second side in the second direction DR2 and then may be bent again to extend toward the first side in the first direction DR1.

The portion connected to the long side of the fifth connection electrode CNE5 on the second side in the second direction DR2 and extending in the first direction DR1 beyond the short side on the first side in the first direction DR1 may be disposed between the first connection electrode CNE1 and the second connection electrode CNE2 in a plan view.

The fifth connection electrode CNE5 may be disposed on a first electrode RME1 or the second bank pattern BP2. The portion connected to the long side of the fifth connection electrode CNE5 on the second side in the second direction DR2 and extending in the first direction DR1 beyond the short side on the first side in the first direction DR1 may be disposed on a second electrode RME2.

Among the connection electrodes CNE, the first connection electrode CNE1, the second connection electrode CNE2, and the fourth connection electrode CNE4 may be disposed on the second insulating layer PAS2, may be disposed on (or at) the same layer, and may include the same material. Among the connection electrodes CNE, the third connection electrode CNE3 and the fifth connection electrode CNE5 may be disposed on the third insulating layer PAS3 to be described later, may be disposed on (or at) the same layer, and may include the same material. For ease of description, a conductive layer in which the first connection electrode CNE1, the second connection electrode CNE2, and the fourth connection electrode CNE4 are disposed will hereinafter be referred to as a first connection conductive layer, and a conductive layer in which the third connection electrode CNE3 and the fifth connection electrode CNE5 are disposed will hereinafter be referred to as a second connection conductive layer.

Each of the first connection conductive layer and the second connection conductive layer may include a conductive material such as ITO, IZO, ITZO, or aluminum (Al). For example, the connection electrodes CNE may include a transparent conductive material, and light emitted from the light emitting elements ED may be output through the connection electrodes CNE.

The first connection electrode CNE1, the second connection electrode CNE2, and the fourth connection electrode CNE4 of the first connection conductive layer may contact ends of the light emitting elements ED exposed by the pattern portion of the second insulating layer PAS2. For example, each of the first connection electrode CNE1 and the second connection electrode CNE2 may contact the first ends of the light emitting elements ED, and the fourth connection electrode CNE4 may contact the second ends of the light emitting elements ED.

Each of the first connection electrode CNE1, the second connection electrode CNE2, and the fourth connection electrode CNE4 of the first connection conductive layer may contact an upper surface of the pattern portion of the second insulating layer PAS2.

The third insulating layer PAS3 may be disposed on the first connection conductive layer. The third insulating layer PAS3 is disposed on the connection electrodes CNE1, CNE2 and CNE4 and the second insulating layer PAS2. The third insulating layer PAS3 may be disposed on the entire surface of the second insulating layer PAS2 to cover the connection electrodes CNE1, CNE2, and CNE4 of the first connection conductive layer.

The third insulating layer PAS3 may insulate the connection electrodes CNE1, CNE2 and CNE4 of the first connection conductive layer from the connection electrodes CNE3 and CNE5 of the second connection conductive layer so that they do not directly contact each other.

However, in some areas, the third insulating layer PAS3 may include insulating open portions PNT to partially expose upper surfaces of the connection electrodes CNE1, CNE2 and CNE4 of the first connection conductive layer. The insulating open portions PNT of the third insulating layer PAS3 may be formed at positions where the connection electrodes CNE1, CNE2 and CNE4 of the first connection conductive layer are highly likely to be broken. Each of the connection electrodes CNE1, CNE2 and CNE4 may be highly likely to be broken in an area where the above-described light emitting elements ED under the first connection conductive layer agglomerate.

The insulating open portions PNT of the third insulating layer PAS3 formed at the positions where the connection electrodes CNE1, CNE2 and CNE4 of the first connection conductive layer are highly likely to be broken may include a first insulating open portion PNT1, a second insulating open portion PNT2, a fifth insulating open portion PNT5, and a sixth insulating open portion PNT6. Dummy electrodes DE may be disposed in the insulating open portions PNT1, PNT2, PNT5, and PNT6, respectively. The dummy electrodes DE may include a first dummy electrode DE1 disposed in the first insulating open portion PNT1, a second dummy electrode DE2 disposed in the second insulating open portion PNT2, a fifth dummy electrode DE5 disposed in the fifth insulating open portion PNT5, and a sixth dummy electrode DE6 disposed in the sixth insulating open portion PNT6. The dummy electrodes DE1, DE2, DE5 and DE6 may be disposed in the second connection conductive layer to be described later.

In addition, the insulating open portions PNT of the third insulating layer PAS3 may be formed at positions where the connection electrodes CNE3 and CNE5 of the second connection conductive layer to be described later are highly likely to be broken. Each of the connection electrodes CNE3 and CNE5 may be highly likely to be broken in an area where the above-described light emitting elements ED under the second connection conductive layer agglomerate.

The insulating open portions PNT of the third insulating layer PAS3 formed at the positions where the connection electrodes CNE3 and CNE5 of the second connection conductive layer are highly likely to be broken may include a third insulating open portion PNT3 and a fourth insulating open portion PNT4. Dummy electrodes DE may be disposed in the insulating open portions PNT3 and PNT4, respectively. The dummy electrodes DE may include a third dummy electrode DE3 disposed in the third insulating open portion PNT3 and a fourth dummy electrode DE4 disposed in the fourth insulating open portion PNT4. The dummy electrodes DE3 and DE4 may be disposed in the first connection conductive layer described above.

The second connection conductive layer described above may be disposed on the third insulating layer PAS3 and the first connection conductive layer.

The third connection electrode CNE3 and the fifth connection electrode CNE5 of the second connection conductive layer may contact ends of the light emitting elements ED exposed by the pattern portion of the second insulating layer PAS2.

For example, in the case of the third connection electrode CNE3 having a substantially rectangular shape including an open portion therein in a plan view, the long side on the first side in the second direction DR2 may contact the second ends of the light emitting elements ED, and the portion connected to the long side of the third connection electrode CNE3 on the first side in the second direction DR2 and extending in the first direction DR1 beyond the short side on the second side in the first direction DR1 may contact the first ends of the light emitting elements ED. Further, in the case of the fifth connection electrode CNE5 having a substantially rectangular shape including an open portion therein in a plan view, the long side on the second side in the second direction DR2 may contact the first ends of the light emitting elements ED, and the portion connected to the long side of the fifth connection electrode CNE5 on the second side in the second direction DR2 and extending in the first direction DR1 beyond the short side on the first side in the first direction DR1 may contact the second ends of the light emitting elements ED.

Each of the third connection electrode CNE3 and the fifth connection electrode CNE5 may contact a side surface and an upper surface of the third insulating layer PAS3 on the pattern portion of the second insulating layer PAS2.

Each of the first insulating layer PAS1, the second insulating layer PAS2, and the third insulating layer PAS3 described above may include an insulating inorganic material or an insulating organic material. For example, each of the first insulating layer PAS1, the second insulating layer PAS2, and the third insulating layer PAS3 may include an insulating inorganic material. Alternatively, the first insulating layer PAS1 or the third insulating layer PAS3 may include an insulating inorganic material, and the second insulating layer PAS2 may include an insulating organic material. Each or at least any one of the first insulating layer PAS1, the second insulating layer PAS2, and the third insulating layer PAS3 may also be formed in a structure in which a plurality of insulating layers are alternately or repeatedly stacked. In an example embodiment, each of the first insulating layer PAS1, the second insulating layer PAS2, and the third insulating layer PAS3 may be any one selected from among silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material, some of them may be made of the same material or different materials, or all of them may be made of different materials.

The placement positions of the insulating open portions PNT of the third insulating layer PAS3 described above and the placement positions of the dummy electrodes DE will now be described. The insulating open portions PNT may completely penetrate the third insulating layer PAS3 in the thickness direction. The first insulating open portion PNT1 may overlap the first connection electrode CNE1. The first insulating open portion PNT1 may be formed over the emission area EMA and the bank layer BNL. The first insulating open portion PNT1 may be disposed between the third connection electrode CNE3 and the fifth connection electrode CNE5 in a plan view.

The second insulating open portion PNT2 may overlap the second connection electrode CNE2. The second insulating open portion PNT2 may be disposed on a long side, on the second side in the second direction DR2, of the second connection electrode CNE2 having a rectangular shape including an open portion therein in a plan view.

The second insulating open portion PNT2 may be formed over the emission area EMA and the bank layer BNL. The second insulating open portion PNT2 may be disposed between the fifth connection electrode CNE5 and a long side, on the first side in the second direction DR2, of the second connection electrode CNE2 having a rectangular shape including an open portion therein in a plan view.

The fifth insulating open portion PNT5 may overlap the fourth connection electrode CNE4. The fifth insulating open portion PNT5 may be disposed on a long side, on the first side in the second direction DR2, of the fourth connection electrode CNE4 having a rectangular shape including an open portion therein in a plan view.

The fifth insulating open portion PNT5 may be formed over the emission area EMA and the bank layer BNL. The fifth insulating open portion PNT5 may be disposed between a portion connected to a long side of the third connection electrode CNE3 on the first side in the second direction DR2 and extending in the first direction DR1 beyond a short side on the second side in the first direction DR1 in a plan view and a long side, on the second side in the second direction DR2, of the fourth connection electrode CNE4 having a rectangular shape including an open portion therein in a plan view.

The sixth insulating open portion PNT6 may be disposed on a portion connected to a short side of the fourth connection electrode CNE4 on the second side in the first direction DR1, extending in the second direction DR2 beyond a long side on the first side in the second direction DR2, and bent to extend toward the first side in the first direction DR1.

The sixth insulating open portion PNT6 may be disposed between the portion connected to the long side of the third connection electrode CNE3 on the first side in the second direction DR2 and extending in the first direction DR1 beyond the short side on the second side in the first direction DR1 in a plan view and the fifth connection electrode CNE5.

The third insulating open portion PNT3 may overlap the third connection electrode CNE3. The third insulating open portion PNT3 may overlap the portion connected to the long side of the third connection electrode CNE3 on the first side in the second direction DR2 and extending beyond the short side on the second side in the first direction DR1. For example, the third insulating open portion PNT3 may overlap a portion connected to the long side of the third connection electrode CNE3 on the first side in the second direction DR2 and extending along the first direction DR1, a portion bent to extend toward the first side in the second direction DR2, and a portion bent to extend toward the second side in the first direction DR1.

The fourth insulating open portion PNT4 may overlap the fifth connection electrode CNE5. The fourth insulating open portion PNT4 may overlap a portion connected to a long side of the fifth connection electrode CNE5 on the second side in the second direction DR2 and extending beyond a short side on the first side in the first direction DR1. For example, the fourth insulating open portion PNT4 may overlap a portion connected to the long side of the fifth connection electrode CNE5 on the second side in the second direction DR2 and extending along the first direction DR1, a portion bent to extend toward the second side in the second direction DR2, and a portion bent to extend toward the first side in the first direction DR1.

The dummy electrodes DE1 through DE6 may be disposed in the insulating open portions PNT1 through PNT6, respectively. That is, the first dummy electrode DE1 may be disposed in the first insulating open portion PNT1, the second dummy electrode DE2 may be disposed in the second insulating open portion PNT2, the third dummy electrode DE3 may be disposed in the third insulating open portion PNT3, the fourth dummy electrode DE4 may be disposed in the fourth insulating open portion PNT4, the fifth dummy electrode DE5 may be disposed in the fifth insulating open portion PNT5, and the sixth dummy electrode DE6 may be disposed in the sixth insulating open portion PNT6.

In each of the insulating open portions PNT1 through PNT6, each of the dummy electrodes DE1 through DE6 may directly contact an overlapping connection electrode CNE. That is, the first dummy electrode DE1 may directly contact the first connection electrode CNE1 in the first insulating open portion PNT1, the second dummy electrode DE2 may directly contact the second connection electrode CNE2 in the second insulating open portion PNT2, the third dummy electrode DE3 may directly contact the third connection electrode CNE3 in the third insulating open portion PNT3, the fourth dummy electrode DE4 may directly contact the fifth connection electrode CNE5 in the fourth insulating open portion PNT4, the fifth dummy electrode DE5 may directly contact the fourth connection electrode CNE4 in the fifth insulating open portion PNT5, and the sixth dummy electrode DE6 may directly contact the fourth connection electrode CNE4 in the sixth insulating open portion PNT6.

As described above, the connection electrodes CNE may be highly likely to be broken in an area where the above-described light emitting elements ED under the first connection conductive layer agglomerate and/or in an area where the above-described light emitting elements ED under the second connection conductive layer agglomerate. When a connection electrode CNE is broken, the broken portion may be seen as a dark spot from the outside, which may cause a display defect of the display device 10.

However, in the display device 10 according to one or more embodiments of the present disclosure, the third insulating layer PAS3 adopts a structure in which it includes the insulating open portions PNT, and the connection electrodes CNE directly contact the dummy electrodes DE in the insulating open portions PNT. In this structure, even if any one of the connection electrodes CNE were broken, a dark spot may not be seen from the outside due to a dummy electrode DE in direct contact with an upper surface or a lower surface of the connection electrode CNE. In addition, driving failure of the light emitting elements ED due to the breakage of the connection electrode CNE can be prevented in advance.

Figure 9:
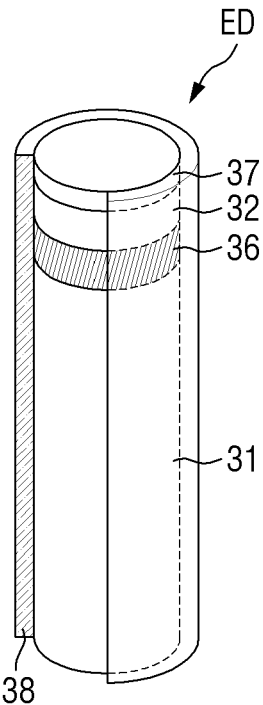
FIG. 9 is a schematic cutaway view of a light emitting element according to one or more embodiments.

FIG. 9 is a schematic cutaway view of a light emitting element ED according to one or more embodiments.

Referring to FIG. 9, the light emitting element ED may be a light emitting diode. Specifically, the light emitting element ED may be an inorganic light emitting diode having a size in a nanometer or micrometer range and made of an inorganic material. When an electric field is formed in a specific direction between two electrodes facing each other, the light emitting element ED may be aligned between the two electrodes in which polarity is formed.

The light emitting element ED according to one or more embodiments may extend in one direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped or a hexagonal prism, and a shape extending in a direction and having a partially inclined outer surface.

The light emitting element ED may include a semiconductor layer doped with a dopant of any conductivity type (e.g., a p-type or an n-type). The semiconductor layer may receive an electrical signal from an external power source and emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be any one or more of AlGaInN, GaN, AlGaN, InGaN, AlN, and InN doped with an n-type dopant. The n-type dopant used to dope the first semiconductor layer 31 may be Si, Ge, Sn, or the like.

The second semiconductor layer 32 is disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be any one or more selected from among AlGaInN, GaN, AlGaN, InGaN, AlN, and InN doped with a p-type dopant. The p-type dopant used to dope the second semiconductor layer 32 may be Mg, Zn, Ca, Ba, or the like.

Although each of the first semiconductor layer 31 and the second semiconductor layer 32 is composed of one layer in the drawing, the present disclosure is not limited thereto. Each of the first semiconductor layer 31 and the second semiconductor layer 32 may also include more layers, for example, may further include a clad layer or a tensile strain barrier reducing (TSBR) layer depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be any one or more selected from among AlGaInN, GaN, AlGaN, InGaN, AlN, InN, and SLs doped with an n-type dopant. The semiconductor layer disposed between the second semiconductor layer 32 and the light emitting layer 36 may be any one or more selected from among AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, it may have a structure in which a plurality of quantum layers and a plurality of well layers are alternately stacked. The light emitting layer 36 may emit light through combination of electron-hole pairs according to electrical signals received through the first semiconductor layer 31 and the second semiconductor layer 32. The light emitting layer 36 may include a material such as AlGaN, AlGaInN, or InGaN. In particular, when the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different Group III to V semiconductor materials depending on the wavelength band of light that it emits. Light emitted from the light emitting layer 36 is not limited to light in a blue wavelength band. In some cases, the light emitting layer 36 may emit light in a red or green wavelength band.

The electrode layer 37 may be an ohmic connection electrode. However, the present disclosure is not limited thereto, and the electrode layer 37 may also be a Schottky connection electrode. The light emitting element ED may include at least one electrode layer 37. The light emitting element ED may include one or more electrode layers 37, but the present disclosure is not limited thereto, and the electrode layer 37 may also be omitted.

When the light emitting element ED is electrically connected to electrodes or connection electrodes in the display device 10, the electrode layer 37 may reduce the resistance between the light emitting element ED and the electrodes or the connection electrodes. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), or indium tin zinc oxide (ITZO).

The insulating film 38 may be disposed around (may surround) outer surfaces (e.g., outer peripheral or circumferential surfaces) of the semiconductor layers and the electrode layer described above. For example, the insulating film 38 may be around (e.g., may surround) an outer surface (e.g., an outer peripheral or circumferential surface) of at least the light emitting layer 36 but may expose both ends of the light emitting element ED in a longitudinal direction. In addition, an upper surface of the insulating film 38 may be rounded in cross section in an area adjacent to at least one end of the light emitting element ED.

The insulating film 38 may include an insulating material, for example, at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). Although the insulating film 38 is illustrated as a single layer in the drawing, the present disclosure is not limited thereto. In one or more embodiments, the insulating film 38 may be formed in a multilayer structure in which a plurality of layers are stacked.

The insulating film 38 may protect the semiconductor layers and the electrode layer of the light emitting element ED. The insulating film 38 may prevent an electrical short circuit that may occur in the light emitting layer 36 when the light emitting layer 36 directly contacts an electrode that transmits an electrical signal to the light emitting element ED. In addition, the insulating film 38 may prevent a reduction in luminous efficiency of the light emitting element ED.

In addition, an outer surface (e.g., an outer peripheral or circumferential surface) of the insulating film 38 may be treated. The light emitting element ED may be sprayed onto electrodes in a state where it is dispersed in ink (e.g., a predetermined ink) and then may be aligned. Here, the surface of the insulating film 38 may be hydrophobic or hydrophilic-treated so that the light emitting element ED is kept separate in the ink without being agglomerated with other adjacent light emitting elements ED.

A method of manufacturing a display device will now be described with reference to other drawings.

FIGS. 10 through 22 are cross-sectional views respectively illustrating process steps of a method of manufacturing a display device according to one or more embodiments. The method of manufacturing the display device according to one or more embodiments will be described with reference to FIGS. 10 through 22 together with FIGS. 4 through 8.

Figure 10:
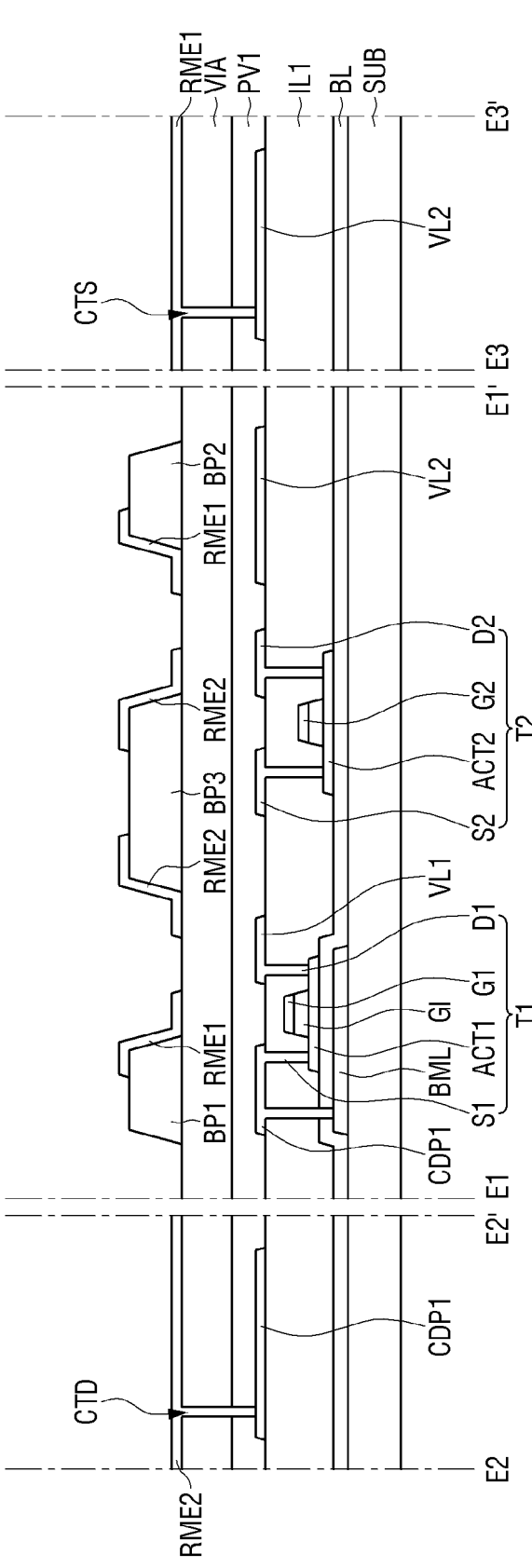
Figure 11:
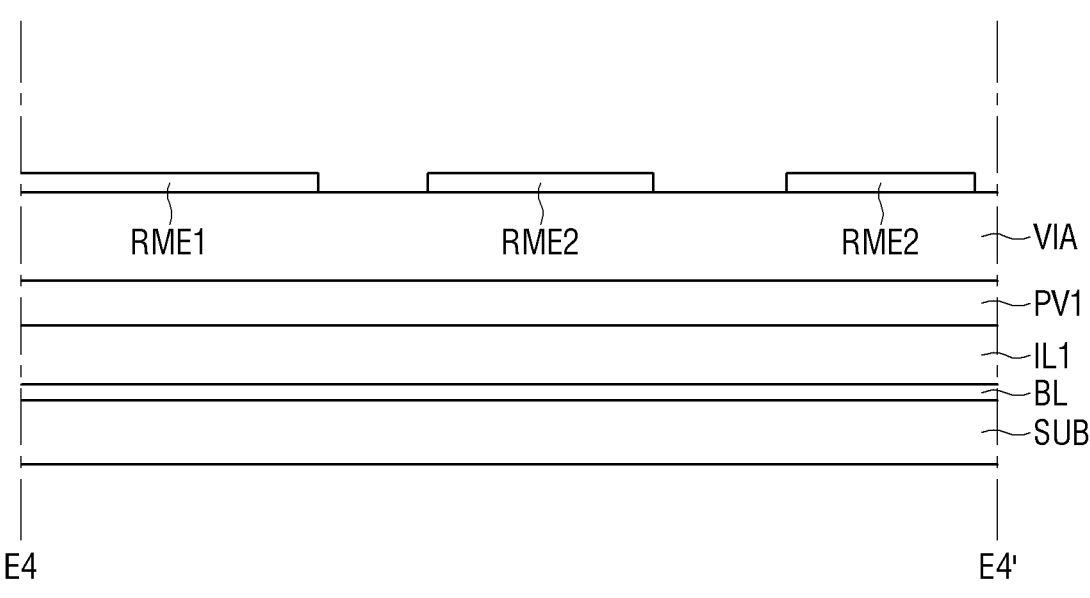

First, referring to FIGS. 4, 10, and 11, in the method of manufacturing the display device 10 according to one or more embodiments, a plurality of electrodes RME (RME1 and RME2) are placed on a substrate SUB in each subpixel SPXn. The electrodes RME1 and RME2 may extend in the first direction DR1 to lie in an emission area EMA and a sub-area SA of each subpixel SPXn and may be spaced from each other in the second direction DR2. The electrodes RME may be electrically connected to light emitting elements ED that will be described later. However, the present disclosure is not limited thereto. The electrodes RME may also not be electrically connected to the light emitting elements ED.

First electrodes RME1 may be disposed on left and right sides of a center of the emission area EMA, respectively, and second electrodes RME2 may be located in the center of the emission area EMA and placed between the first electrodes RME1.

The first electrodes RME1 may be disposed on a first bank pattern BP1 and a second bank pattern BP2, respectively, and the second electrodes RME2 may be disposed on a third bank pattern BP3. The first electrodes RME1 and the second electrodes RME2 may extend beyond a bank layer BNL to lie in a corresponding subpixel SPXn and a portion of the sub-area SA. The first electrodes RME1 and the second electrodes RME2 of different subpixels SPXn may be spaced from each other by a separation portion ROP located in the sub-area SA of any one subpixel SPXn. Each of the electrodes RME may directly contact a conductive pattern CDP1 or VL2 through an electrode contact hole CTD or CTS in a portion overlapping the bank layer BNL between the emission area EMA and the sub-area SA. The electrodes RME may include a conductive material having high reflectivity.

A more detailed description has been given with reference to FIGS. 4, 7, and 8 and thus will be omitted.

Figure 12:
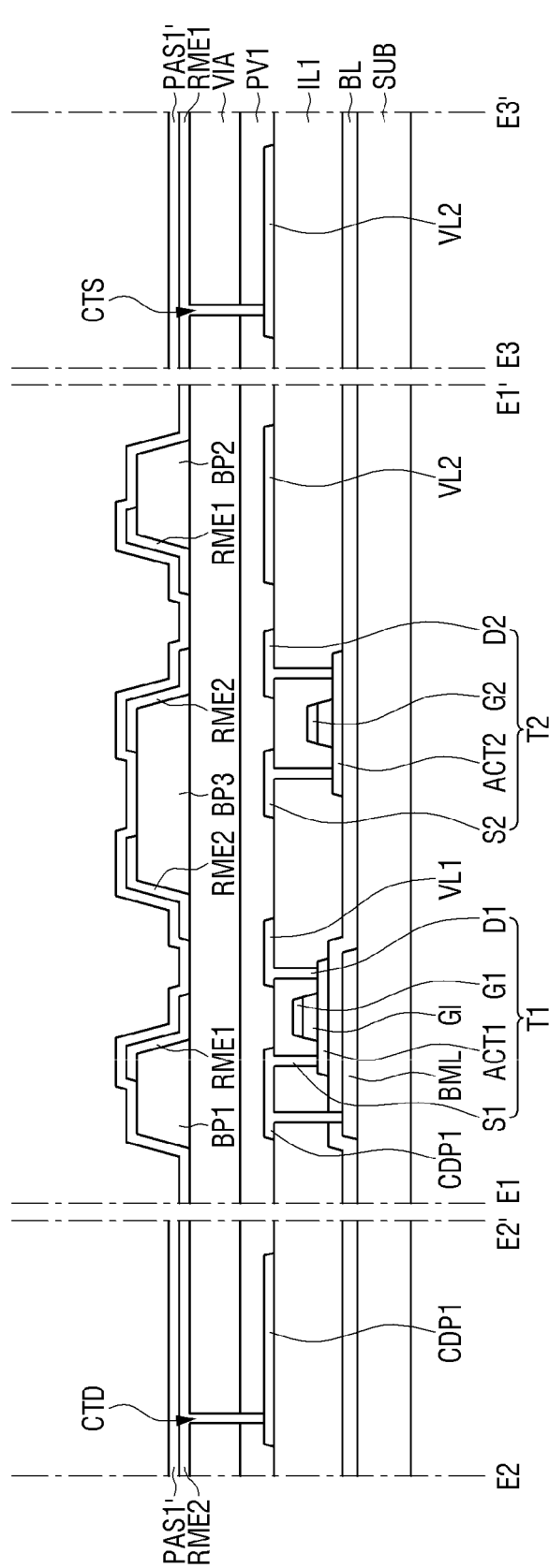
Figure 13:
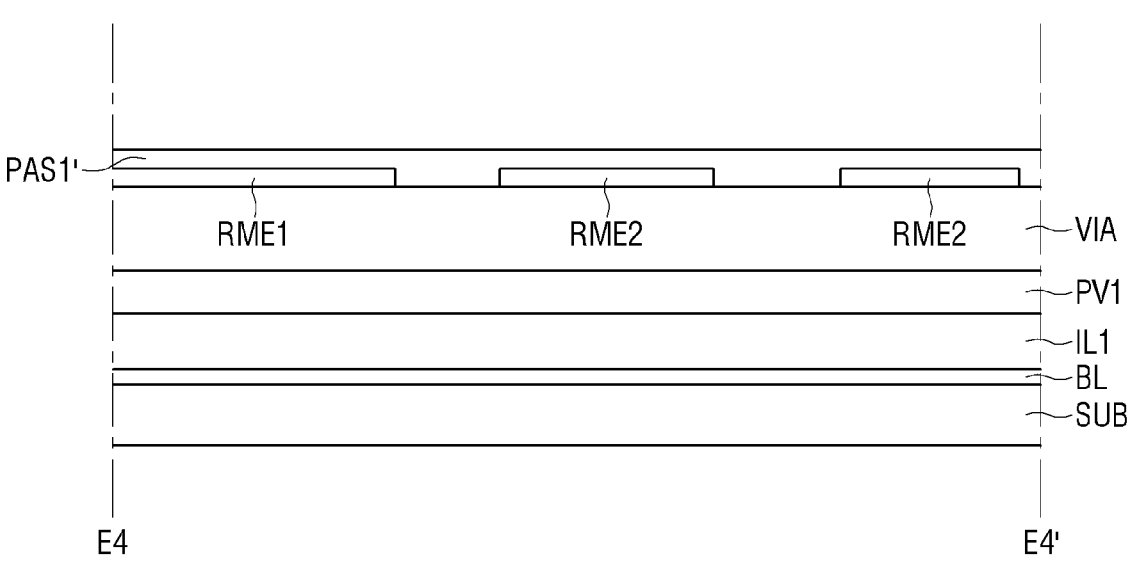

Next, referring to FIGS. 12 and 13, a first insulating layer PAS1' is placed on a via layer VIA and the electrodes RME. The first insulating layer PAS1' may include an insulating material to protect the electrodes RME while insulating different electrodes RME from each other. A more detailed description has been given with reference to FIGS. 4, 7, and 8 and thus will be omitted.

Figure 14:
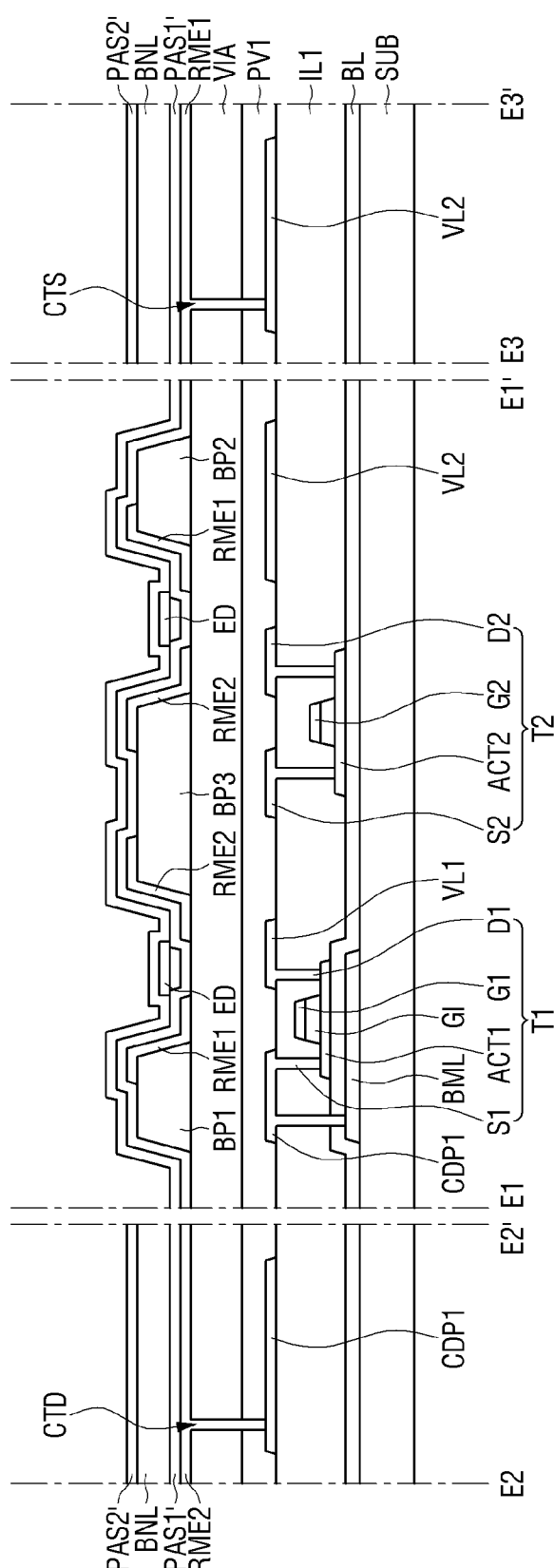
Figure 15:
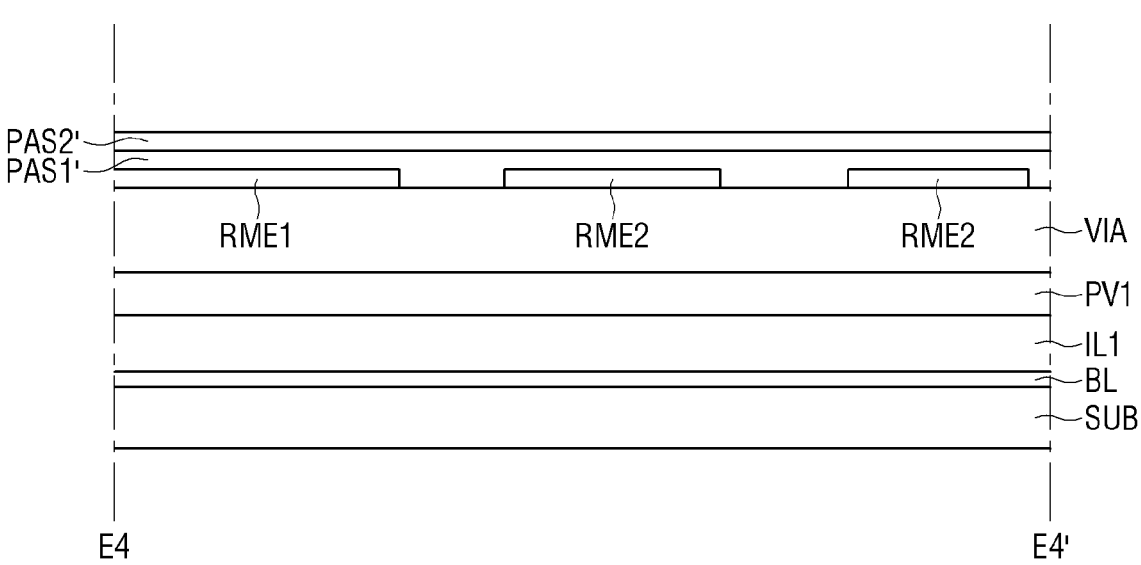

Next, referring to FIGS. 4 and 14, the bank layer BNL is formed. The bank layer BNL may be placed on the first insulating layer PAS1'. The bank layer BNL may include portions extending in the first direction DR1 and the second direction DR2 and may be around (e.g., may surround) each subpixel SPXn. The bank layer BNL may be around (e.g., may surround) the emission area EMA and the sub-area SA of each subpixel SPXn to separate them and may be around (e.g., may surround) the outermost periphery of a display area DPA to separate the display area DPA and a non-display area NDA. The bank layer BNL may be disposed in the entire display area DPA to form a grid pattern, and areas exposed by the bank layer BNL in the display area DPA may be the emission area EMA and the sub-area SA. Like the bank patterns BP1 through BP3, the bank layer BNL may include an organic insulating material such as polyimide.

Next, referring to FIGS. 4, 5, and 14, the light emitting elements ED are placed on the first insulating layer PAS1'. The light emitting elements ED may be placed in the emission area EMA. The light emitting elements ED may be placed between the bank patterns BP1 through BP3 and may be spaced from each other in the first direction DR1. In one or more embodiments, the light emitting elements ED may extend in a direction, and both ends of each light emitting element ED may be placed on different electrodes RME, respectively.

Each of the light emitting elements ED may include a plurality of semiconductor layers disposed along the extending direction, and the semiconductor layers may be sequentially disposed along a direction parallel to an upper surface of the substrate SUB. However, the present disclosure is not limited thereto. When each of the light emitting elements ED has a different structure, the semiconductor layers may be disposed in a direction perpendicular to the substrate SUB.

The light emitting elements ED placed in the subpixels SPXn may emit light of different wavelength bands depending on the materials that form the semiconductor layers described above. However, the present disclosure is not limited thereto, and the light emitting elements ED placed in the subpixels SPXn may also emit light of the same color by including the semiconductor layers made of the same material.

Next, referring to FIGS. 4, 5, 6, 14, and 15, a second insulating layer PAS2' is placed on the light emitting elements ED, the first insulating layer PAS1', and the bank layer BNL. Each of the first insulating layer PAS1' described above, the second insulating layer PAS2', and a third insulating layer PAS3' to be described later may include an insulating inorganic material or an insulating organic material.

Next, referring to FIGS. 4, 5, 6, and 16, a second insulating layer PAS2 and a first insulating layer PAS1 are formed. The second insulating layer PAS2 may be formed by etching the second insulating layer PAS2' described above with reference to FIG. 14. The etching may be, but is not limited to, dry etching.

Figure 16:
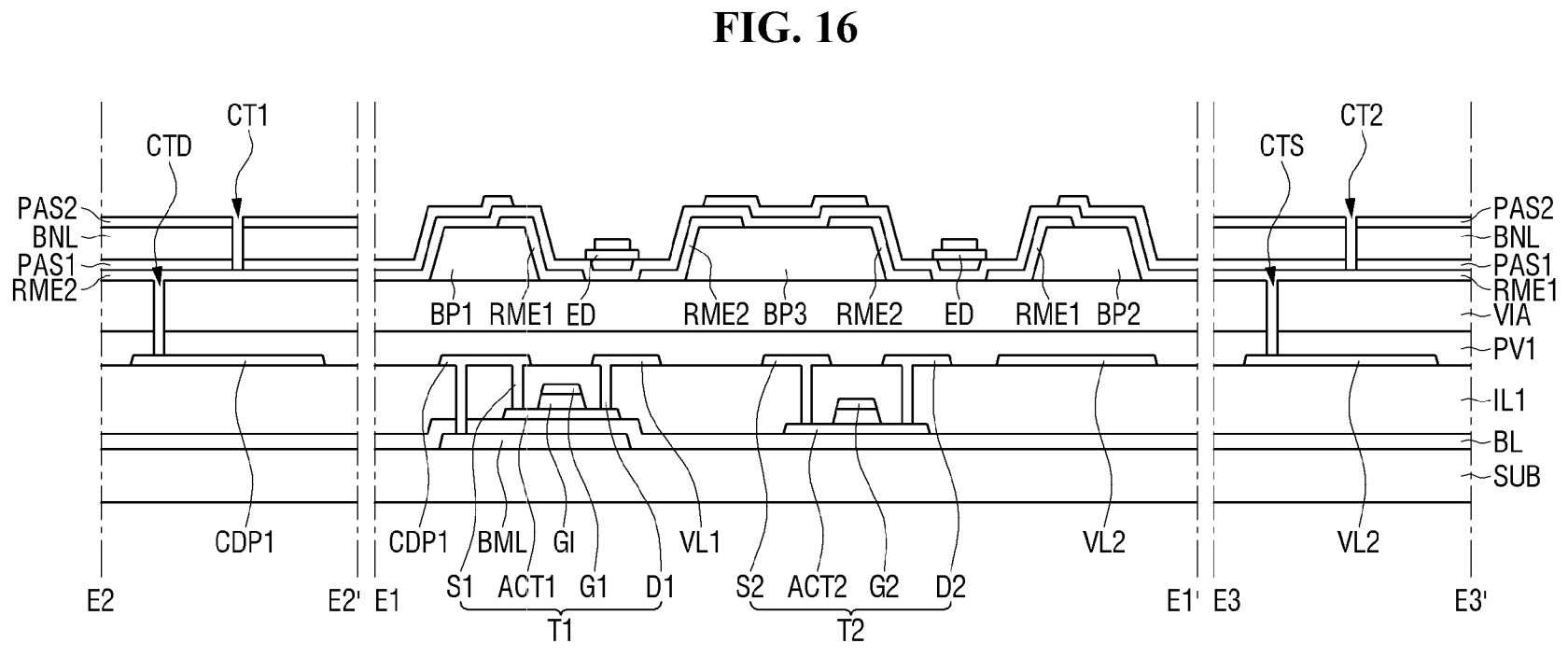

The second insulating layer PAS2 includes a pattern portion extending in the first direction DR1 between the bank patterns BP1 through BP3 and disposed on the light emitting elements ED. The pattern portion may be partially around (may partially surround) outer surfaces (e.g., outer peripheral or circumferential surfaces) of the light emitting elements ED and may not cover both sides or both ends of the light emitting elements ED. The pattern portion may form a linear or island-shaped pattern in each subpixel SPXn in a plan view. Each of the insulating layers PAS1 and PAS2 may include a plurality of contact portions CT1 and CT2 formed in portions in which connection electrodes CNE and the electrodes RME are connected. In FIG. 16, the bank layer BNL also includes the contact portions CT1 and CT2. However, the contact portions CT1 and CT2 may also not be formed in the bank layer BNL and may be formed in an area where the bank layer BNL is not disposed. In this case, the contact portions CT1 and CT2 may be formed only in the insulating layers PAS1 and PAS2.

Figure 17:
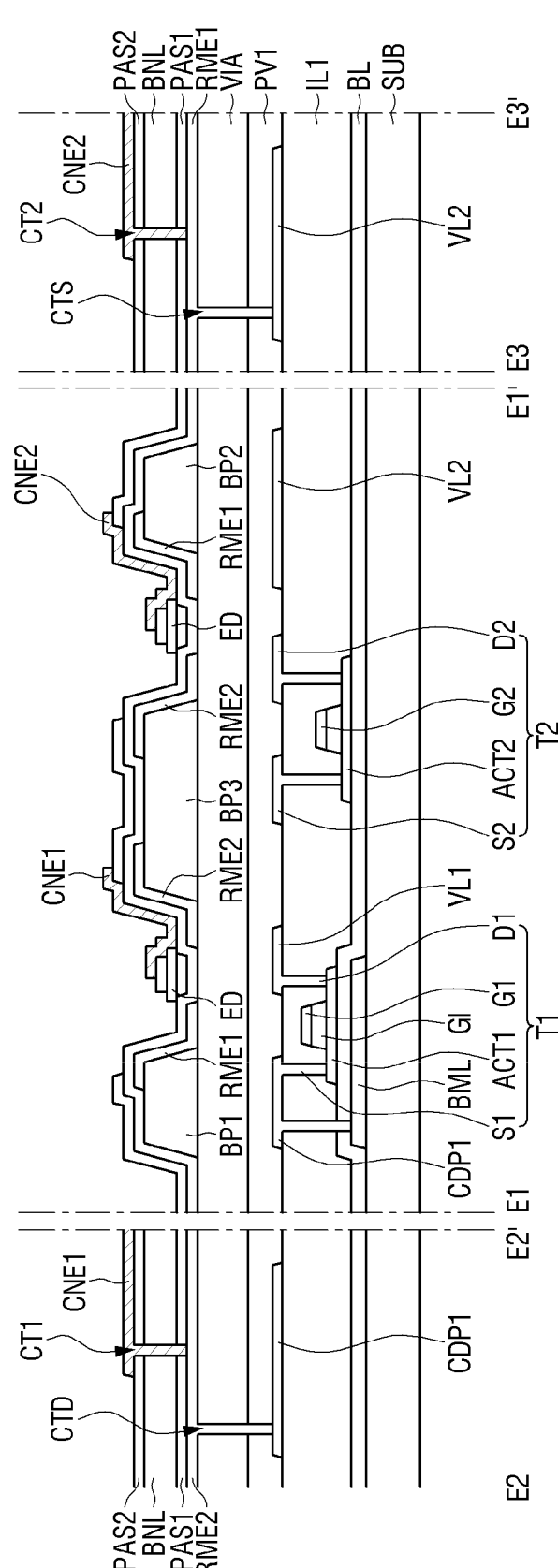
Figure 18:
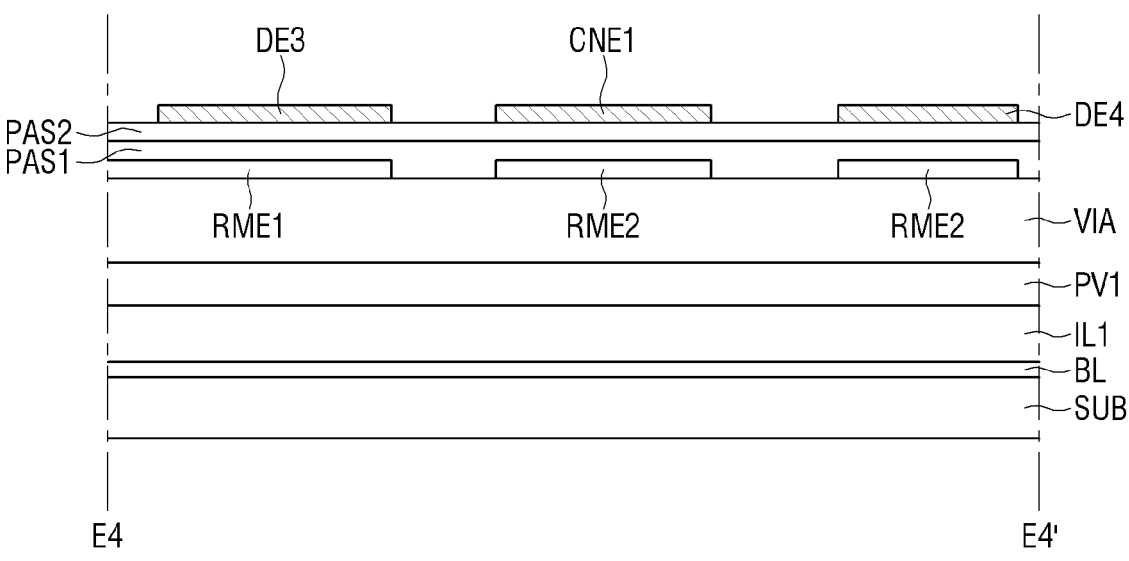
Figure 19:
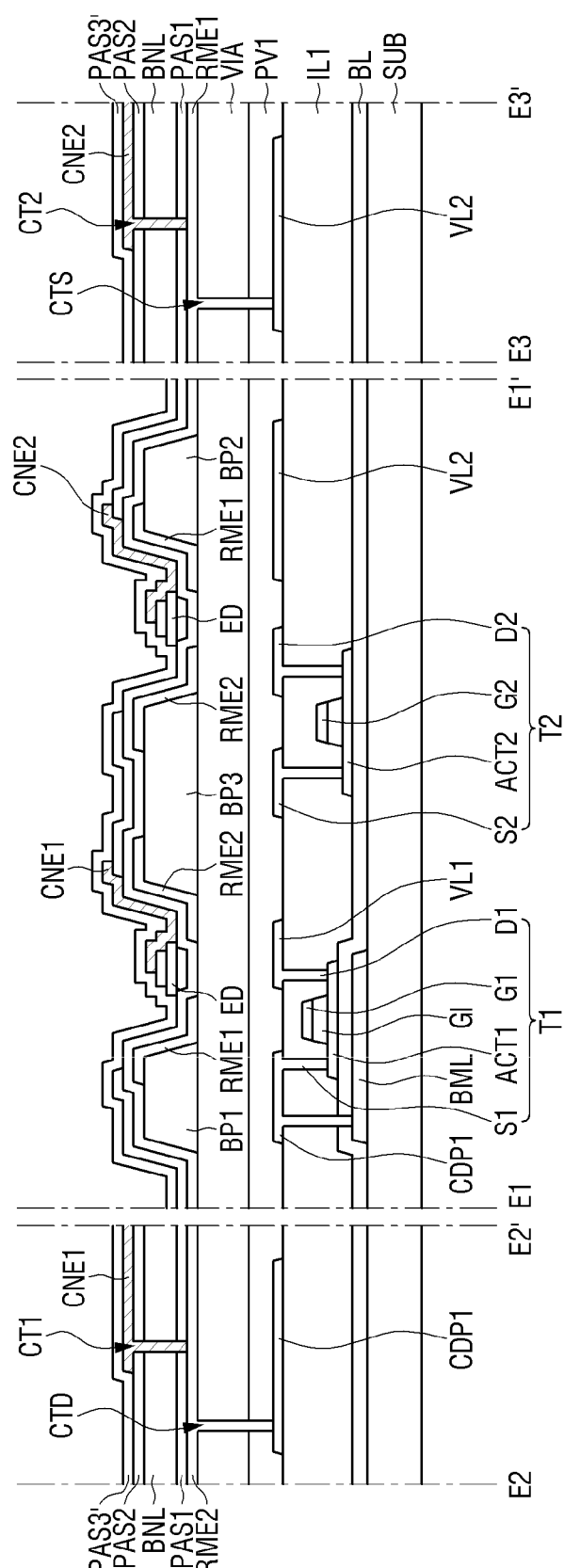
Figure 20:
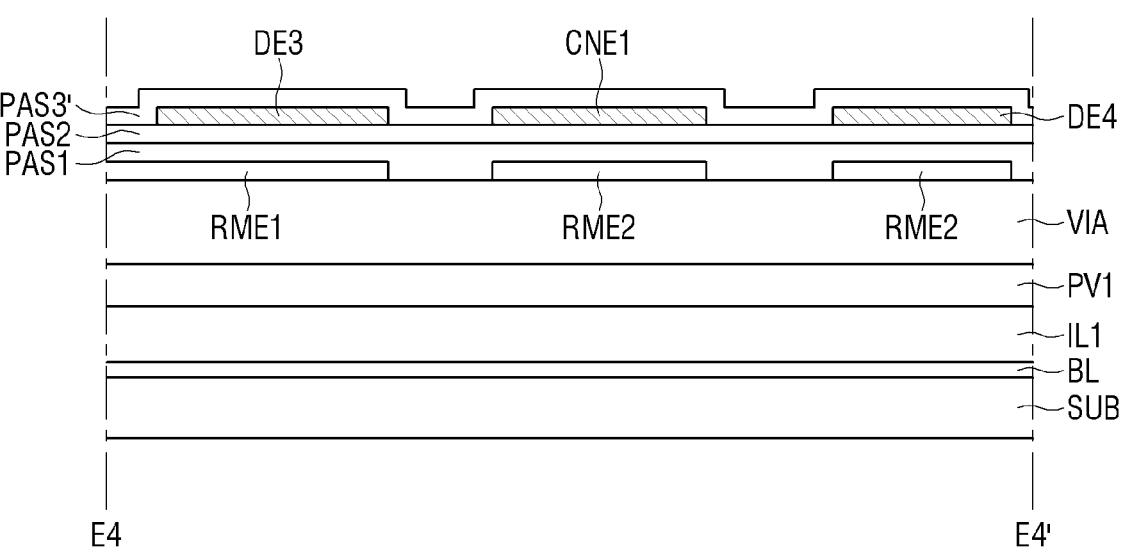
Figure 21:
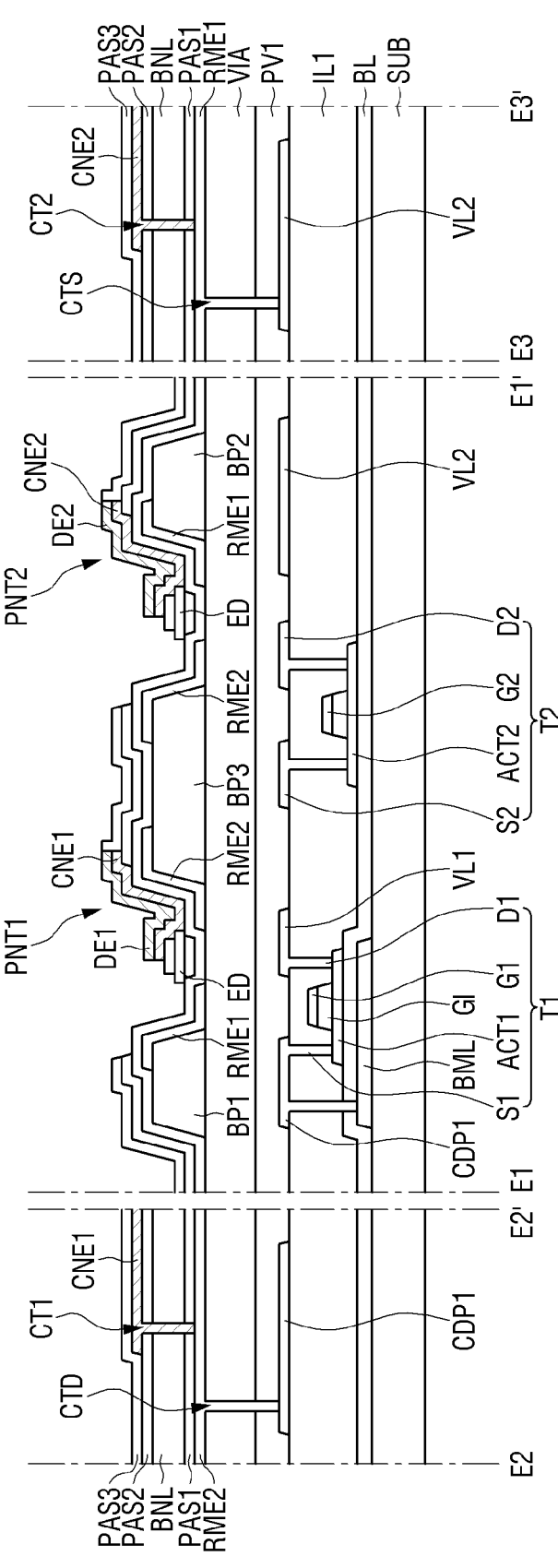
Figure 22:
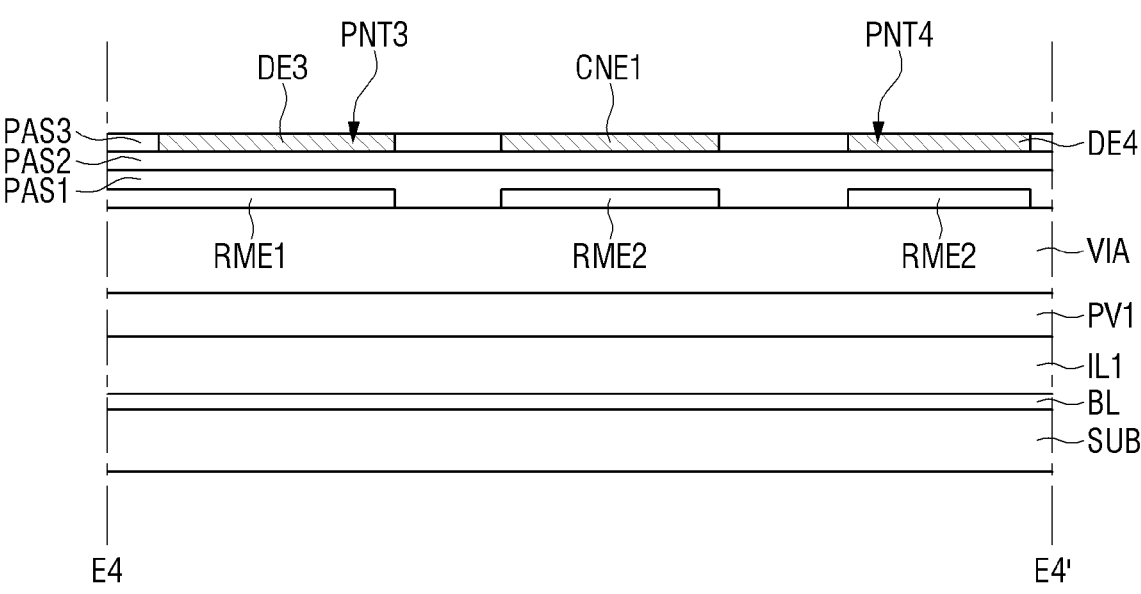

Next, referring to FIGS. 17 and 18, a first connection conductive layer is formed on the second insulating layer PAS2.

The first connection conductive layer may include a first connection electrode CNE1, a second connection electrode CNE2, and a fourth connection electrode CNE4. As described above, the first connection conductive layer may include a conductive material such as ITO, IZO, ITZO, or aluminum (Al). For example, the connection electrodes CNE may include a transparent conductive material, and light emitted from the light emitting elements ED may be output through the connection electrodes CNE. The first connection electrode CNE1, the second connection electrode CNE2, and the fourth connection electrode CNE4 of the first connection conductive layer may contact ends of the light emitting elements ED exposed by the pattern portion of the second insulating layer PAS2. For example, each of the first connection electrode CNE1 and the second connection electrode CNE2 may contact first ends of the light emitting elements ED, and the fourth connection electrode CNE4 may contact second ends of the light emitting elements ED. The first connection conductive layer may further include dummy electrodes DE3 and DE4. The arrangement of the connection electrodes CNE1, CNE2, and CNE4 and the dummy electrodes DE3 and DE4 of the first connection conductive layer has been described above with reference to FIGS. 4 through 8, and thus a detailed description thereof will be omitted.

Next, referring to FIGS. 4, 7, 8, 19, and 20, the third insulating layer PAS3' is formed on the first connection conductive layer. The third insulating layer PAS3' may cover the connection electrodes CNE1, CNE2, and CNE4 and the dummy electrodes DE3 and DE4 of the first connection conductive layer.

Next, referring to FIGS. 4 through 8, 21, and 22, a third insulating layer PAS3 is formed. The third insulating layer PAS3 may be formed by etching the third insulating layer PAS3' described above with reference to FIGS. 19 and 20. The etching may be, but is not limited to, dry etching.

The third insulating layer PAS3 may include insulating open portions PNT1 through PNT6.

The dummy electrodes DE1 through DE6 may be disposed in the insulating open portions PNT1 through PNT6, respectively. That is, a first dummy electrode DE1 may be disposed in a first insulating open portion PNT1, a second dummy electrode DE2 may be disposed in a second insulating open portion PNT2, a third dummy electrode DE3 may be disposed in a third insulating open portion PNT3, a fourth dummy electrode DE4 may be disposed in a fourth insulating open portion PNT4, a fifth dummy electrode DE5 may be disposed in a fifth insulating open portion PNT5, and a sixth dummy electrode DE6 may be disposed in a sixth insulating open portion PNT6.

In each of the insulating open portions PNT1 through PNT6, each of the dummy electrodes DE1 through DE6 may directly contact an overlapping connection electrode CNE. That is, the first dummy electrode DE1 may directly contact the first connection electrode CNE1 in the first insulating open portion PNT1, the second dummy electrode DE2 may directly contact the second connection electrode CNE2 in the second insulating open portion PNT2, the third dummy electrode DE3 may directly contact a third connection electrode CNE3 in the third insulating open portion PNT3, the fourth dummy electrode DE4 may directly contact a fifth connection electrode CNE5 in the fourth insulating open portion PNT4, the fifth dummy electrode DE5 may directly contact the fourth connection electrode CNE4 in the fifth insulating open portion PNT5, and the sixth dummy electrode DE6 may directly contact the fourth connection electrode CNE4 in the sixth insulating open portion PNT6.

As described above, the connection electrodes CNE may be highly likely to be broken in an area where the above-described light emitting elements ED under the first connection conductive layer agglomerate and/or in an area where the above-described light emitting elements ED under the second connection conductive layer agglomerate. When a connection electrode CNE is broken, the broken portion may be seen as a dark spot from the outside, which may cause a display defect of the display device 10.

However, in the method of manufacturing the display device 10 according to one or more embodiments, the third insulating layer PAS3 adopts a structure in which it includes the insulating open portions PNT, and the connection electrodes CNE directly contact the dummy electrodes DE in the insulating open portions PNT. In this structure, even if any one of the connection electrodes CNE were broken, a dark spot may not be seen from the outside due to a dummy electrode DE in direct contact with an upper surface or a lower surface of the connection electrode CNE. In addition, driving failure of the light emitting elements ED due to the breakage of the connection electrode CNE can be prevented in advance.

Hereinafter, other embodiments of the display device 10 will be described.

Figure 23:
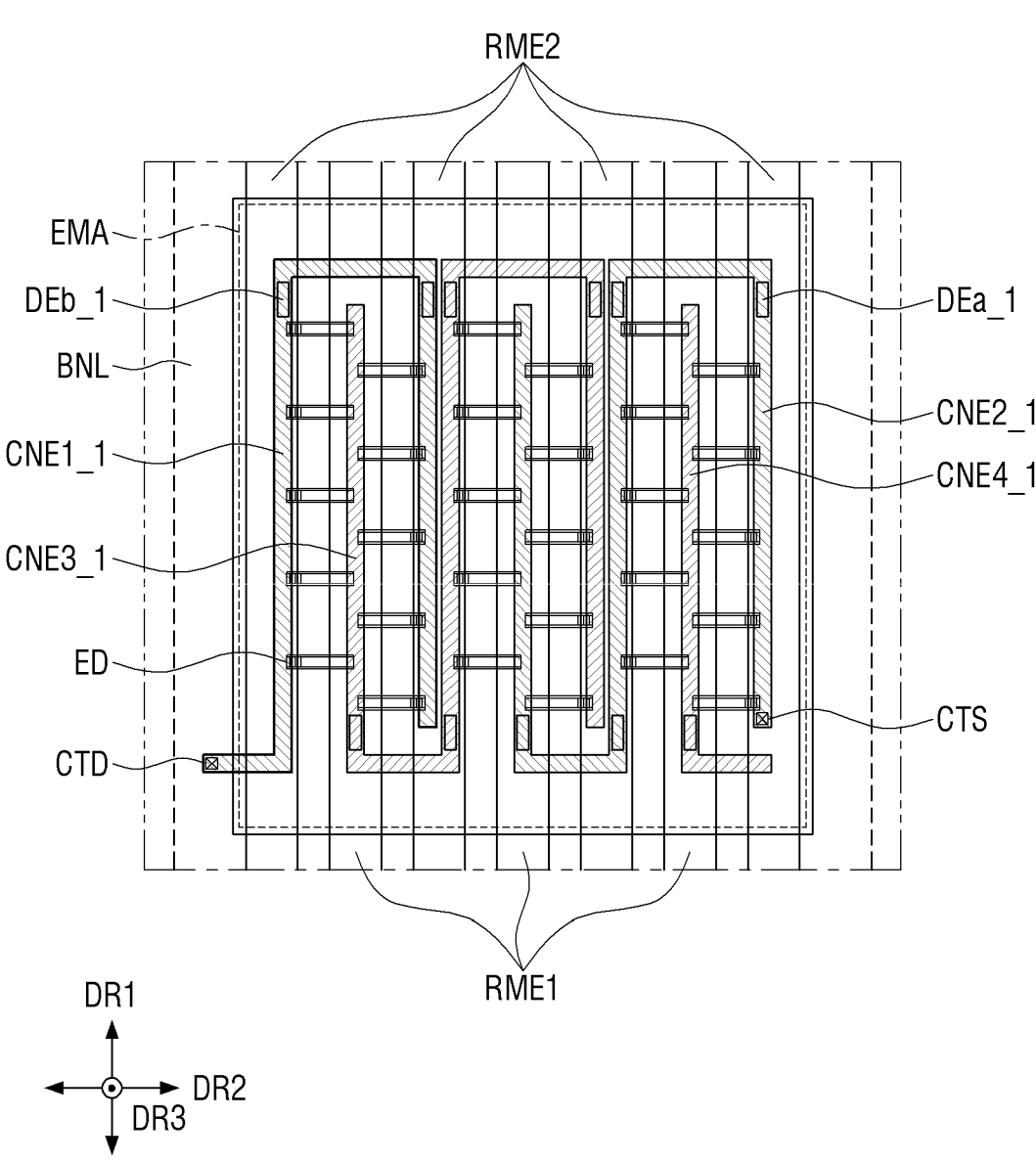
FIG. 23 is a plan view of a subpixel according to one or more embodiments.

FIG. 23 is a plan view of a subpixel according to one or more embodiments.

FIG. 23 illustrates a plurality of electrodes, a plurality of connection electrodes, and light emitting elements disposed in a subpixel of a pixel.

Referring to FIG. 23, a display device according to the current embodiment is different from the display device according to FIG. 4 in that it includes a plurality of connection electrodes CNE1_1, CNE2_1, CNE3_1 and CNE4_1. A first connection electrode CNE1_1 may include a $(1\text{-}1)^{th}$ extension portion extending along the first direction DR1, a $(1\text{-}2)^{th}$ extension portion bent from the $(1\text{-}1)^{th}$ extension portion to extend in the second direction DR2, and a $(1\text{-}3)^{th}$ extension portion bent from the $(1\text{-}2)^{th}$ extension portion to extend toward the second side in the first direction DR1. An end of the $(1\text{-}1)^{th}$ extension portion on the second side in the first direction DR1 may be connected to an electrode contact hole CTD. The $(1\text{-}1)^{th}$ extension portion and the $(1\text{-}3)^{th}$ extension portion may overlap second electrodes RME2, and the $(1\text{-}2)^{th}$ extension portion may overlap a first electrode RME1.

A second connection electrode CNE2_1 may include a $(2\text{-}1)^{th}$ extension portion extending along the first direction DR1, a $(2\text{-}2)^{th}$ extension portion bent in the second direction DR2 from the $(2\text{-}1)^{th}$ extension portion to extend along the second direction DR2, a $(2\text{-}3)^{th}$ extension portion bent in the first direction DR1 from the $(2\text{-}2)^{th}$ extension portion to extend along the first direction DR1, a $(2\text{-}4)^{th}$ extension portion bent in the second direction DR2 from the $(2\text{-}3)^{th}$ extension portion to extend along the second direction DR2, and a $(2\text{-}5)^{th}$ extension portion bent in the first direction DR1 from the $(2\text{-}4)^{th}$ extension portion to extend along the first direction DR1. The $(2\text{-}1)^{th}$ extension portion may overlap a first electrode RME1, the $(2\text{-}2)^{th}$ extension portion may overlap first and second electrodes RME1 and RME2, the $(2\text{-}3)^{th}$ extension portion may overlap a second electrode RME2, the $(2\text{-}4)^{th}$ extension portion may overlap first and second electrodes RME1 and RME2, and the $(2\text{-}5)^{th}$ extension portion may overlap a second electrode RME2. The $(2\text{-}5)^{th}$ extension portion may be connected to an electrode contact hole CTS.

A third connection electrode CNE3_1 may include a $(3\text{-}1)^{th}$ extension portion extending along the first direction DR1, a $(3\text{-}2)^{th}$ extension portion bent from the $(3\text{-}1)^{th}$ extension portion to extend in the second direction DR2, a $(3\text{-}3)^{th}$ extension portion bent from the $(3\text{-}2)^{th}$ extension portion to extend along the first direction DR1, a $(3\text{-}4)^{th}$ extension portion bent in the second direction DR2 from the $(3\text{-}3)^{th}$ extension portion to extend along the second direction DR2, and a $(3\text{-}5)^{th}$ extension portion bent in the first direction DR1 from the $(3\text{-}4)^{th}$ extension portion to extend along the first direction DR1.

The $(3\text{-}1)^{th}$ extension portion may be disposed between the $(1\text{-}1)^{th}$ extension portion and the $(1\text{-}3)^{th}$ extension portion in a plan view, the $(3\text{-}3)^{th}$ extension portion may be disposed between the $(1\text{-}3)^{th}$ extension portion and the $(2\text{-}1)^{th}$ extension portion in a plan view, and the $(3\text{-}5)^{th}$ extension portion may be disposed between the $(2\text{-}1)^{th}$ extension portion and the $(2\text{-}3)^{th}$ extension portion in a plan view. The $(3\text{-}1)^{th}$ extension portion may overlap a first electrode RME1, the $(3\text{-}2)^{th}$ extension portion may overlap first and second electrodes RME1 and RME2, the $(3\text{-}3)^{th}$ extension portion may overlap the second electrode RME2 overlapped by the $(1\text{-}3)^{th}$ extension portion, the $(3\text{-}4)^{th}$ extension portion may overlap first and second electrodes RME1 and RME2, and the $(3\text{-}5)^{th}$ extension portion may overlap the second electrode RME2 overlapped by the $(2\text{-}3)^{th}$ extension portion.

A fourth connection electrode CNE4_1 may include a $(4\text{-}1)^{th}$ extension portion extending along the first direction DR1 and a $(4\text{-}2)^{th}$ extension portion bent in the second direction DR2 from the $(4\text{-}1)^{th}$ extension portion to extend along the second direction DR2. The $(4\text{-}1)^{th}$ extension portion may overlap a first electrode RME1, and the $(4\text{-}2)^{th}$ extension portion may overlap first and second electrodes RME1 and RME2. The $(4\text{-}1)^{th}$ extension portion may be disposed between the $(2\text{-}3)^{th}$ extension portion and the $(2\text{-}5)^{th}$ extension portion.

Light emitting elements ED may be disposed between the $(1\text{-}1)^{th}$ extension portion and the $(3\text{-}1)^{th}$ extension portion, between the $(3\text{-}1)^{th}$ extension portion and the $(1\text{-}3)^{th}$ extension portion, between the $(3\text{-}3)^{th}$ extension portion and the $(2\text{-}1)^{th}$ extension portion, between the $(2\text{-}1)^{th}$ extension portion and the $(3\text{-}5)^{th}$ extension portion, between the $(2\text{-}3)^{th}$ extension portion and the $(4\text{-}1)^{th}$ extension portion, and between the $(4\text{-}1)^{th}$ extension portion and the $(2\text{-}5)^{th}$ extension portion.

Dummy electrodes DEa_1 and DEb_1 may be disposed at an end of the $(1\text{-}1)^{th}$ extension portion on the first side in the first direction DR1, an end of the $(1\text{-}3)^{th}$ extension portion on the first side in the first direction DR1, an end of the $(2\text{-}1)^{th}$ extension portion on the second side in the first direction DR1, an end of the $(2\text{-}3)^{th}$ extension portion on the second side in the first direction DR1, an end of the $(2\text{-}3)^{th}$ extension portion on the first side in the first direction DR1, an end of the $(2\text{-}5)^{th}$ extension portion on the first side in the first direction DR1, an end of the $(3\text{-}1)^{th}$ extension portion on the second side in the first direction DR1, an end of the $(3\text{-}3)^{th}$ extension portion on the second side in the first direction DR1, an end of the $(3\text{-}3)^{th}$ extension portion on the first side in the first direction DR1, an end of the $(3\text{-}5)^{th}$ extension portion on the first side in the first direction DR1, and an end of the $(4\text{-}1)^{th}$ extension portion on the second side in the first direction DR1.

As described above, the connection electrodes CNE may be highly likely to be broken in an area where the above-described light emitting elements ED under a first connection conductive layer agglomerate and/or in an area where the above-described light emitting elements ED under a second connection conductive layer agglomerate. When a connection electrode CNE_1, CNE2_1, CNE3_1 or CNE4_1 is broken, the broken portion may be seen as a dark spot from the outside, which may cause a display defect of the display device.

However, also in the display device according to the current embodiment, a third insulating layer PAS3 (see FIG. 6) adopts a structure in which it includes insulating openings in which the dummy electrodes DEa_1 and DEb_1 are disposed, and the connection electrodes CNE1_1, CNE2_1, CNE3_1 and CNE4_1 directly contact the dummy electrodes DEa_1 and DEb_1 in the insulating openings. In this structure, even if any one of the connection electrodes CNE1_1, CNE2_1, CNE3_1 and CNE4_1 were broken, a dark spot may not be seen from the outside due to a dummy electrode DEa_1 or DEb_1 in direct contact with an upper surface or a lower surface of the connection electrode CNE1_1, CNE2_1, CNE3_1 or CNE4_1. In addition, driving failure of the light emitting elements ED due to the breakage of the connection electrode CNE1_1, CNE2_1, CNE3_1 or CNE4_1 can be prevented in advance.

Figure 24:
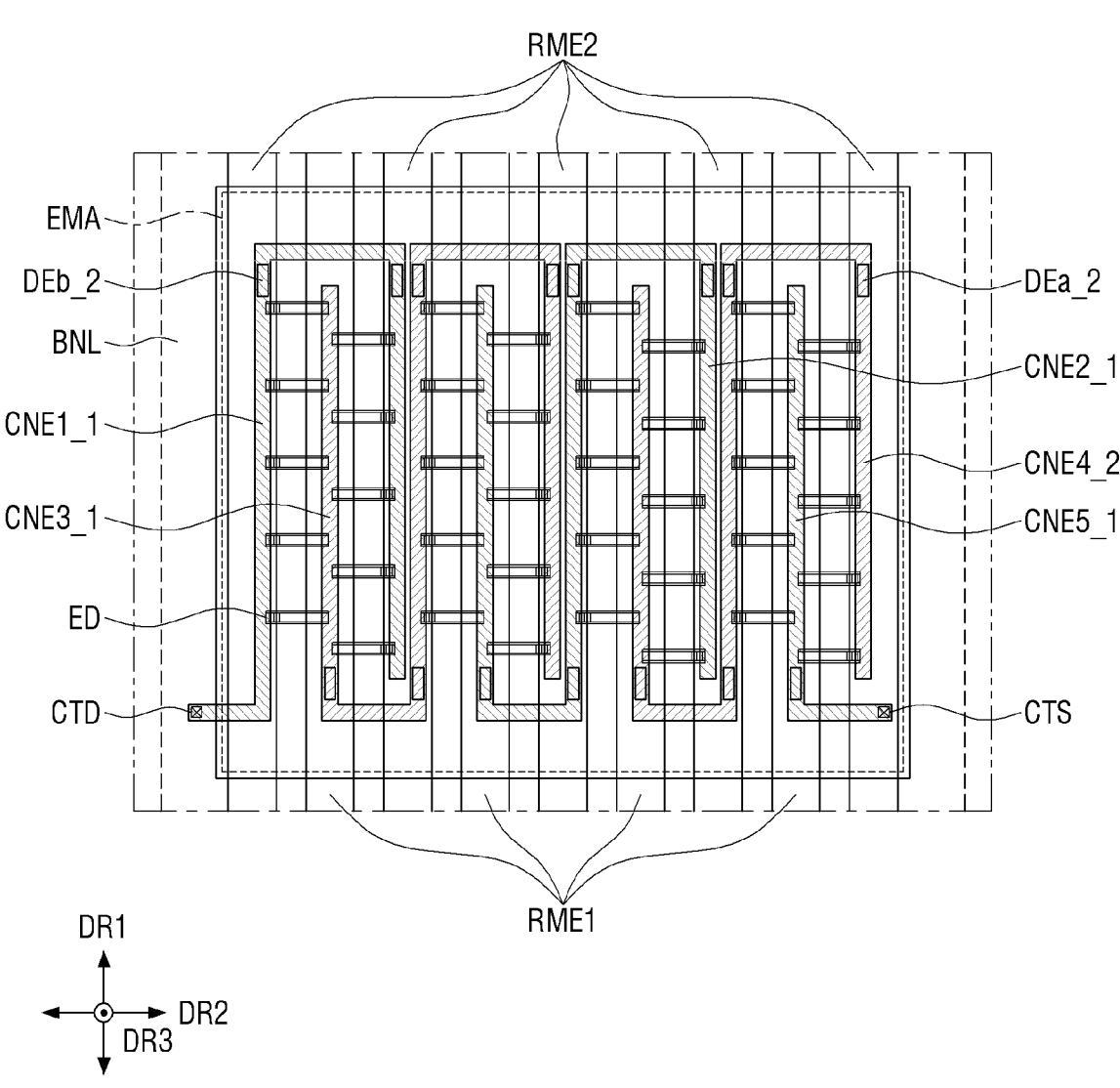
FIG. 24 is a plan view of a subpixel according to one or more embodiments.

FIG. 24 is a plan view of a subpixel according to one or more embodiments.

Referring to FIG. 24, a display device according to the current embodiment is different from the display device according to FIG. 23 in that it further includes a fifth connection electrode CNE5_1.

More specifically, a fourth connection electrode CNE4_2 may further include a $(4\text{-}3)^{th}$ extension portion bent in the first direction DR1 from a $(4\text{-}2)^{th}$ extension portion to extend along the first direction DR1, a $(4\text{-}4)^{th}$ extension portion bent in the second direction DR2 from the $(4\text{-}3)^{th}$ extension portion to extend along the second direction DR2, and a $(4\text{-}5)^{th}$ extension portion bent in the first direction DR1 from the $(4\text{-}4)^{th}$ extension portion to extend in the first direction DR1. The $(4\text{-}3)^{th}$ extension portion may overlap a second electrode RME2 overlapped by a $(2\text{-}5)^{th}$ extension portion, the $(4\text{-}4)^{th}$ extension portion may overlap first and second electrodes RME1 and RME2, and the $(4\text{-}5)^{th}$ extension portion may overlap a second electrode RME2. The fifth connection electrode CNE5_1 may include a $(5\text{-}1)^{th}$ extension portion extending along the first direction DR1 and a $(5\text{-}2)^{th}$ extension portion bent in the second direction DR2 from the $(5\text{-}1)^{th}$ extension portion to extend along the second direction DR2. The $(5\text{-}1)^{th}$ extension portion may be disposed between the $(4\text{-}3)^{th}$ extension portion and the $(4\text{-}5)^{th}$ extension portion in a plan view, and an end of the $(5\text{-}2)^{th}$ extension portion may be connected to an electrode contact hole CTS.

Light emitting elements ED may be further disposed between the $(4\text{-}3)^{th}$ extension portion and the $(5\text{-}1)^{th}$ extension portion and between the $(5\text{-}1)^{th}$ extension portion and the $(4\text{-}5)^{th}$ extension portion.

Dummy electrodes DEa_2 and DEb_2 may be further disposed at an end of the $(4\text{-}3)^{th}$ extension portion on the second side in the first direction DR1, an end of the $(4\text{-}3)^{th}$ extension portion on the first side in the first direction DR1, an end of the $(4\text{-}5)^{th}$ extension portion on the first side in the first direction DR1, and an end of the $(5\text{-}1)^{th}$ extension portion on the second side in the first direction DR1.

As described above, the connection electrodes CNE may be highly likely to be broken in an area where the above-described light emitting elements ED under a first connection conductive layer agglomerate and/or in an area where the above-described light emitting elements ED under a second connection conductive layer agglomerate. When a connection electrode CNE_1, CNE2_1, CNE3_1, CNE4_1 or CNE5_1 is broken, the broken portion may be seen as a dark spot from the outside, which may cause a display defect of the display device.

However, also in the display device according to the current embodiment, a third insulating layer PAS3 (see FIG.

6) adopts a structure in which it includes insulating openings in which the dummy electrodes DEa_2 and DEb_2 are disposed, and the connection electrodes CNE1_1, CNE2_1, CNE3_1, CNE4_1 and CNE5_1 directly contact the dummy electrodes DEa_2 and DEb_2 in the insulating openings. In this structure, even if any one of the connection electrodes CNE1_1, CNE2_1, CNE3_1, CNE4_1 and CNE5_1 were broken, a dark spot may not be seen from the outside due to a dummy electrode DEa_2 or DEb_2 in direct contact with an upper surface or a lower surface of the connection electrode CNE1_1, CNE2_1, CNE3_1, CNE4_1 or CNE5_1. In addition, driving failure of the light emitting elements ED due to the breakage of the connection electrode CNE1_1, CNE2_1, CNE3_1, CNE4_1 or CNE5_1 can be prevented in advance.

Figure 25:
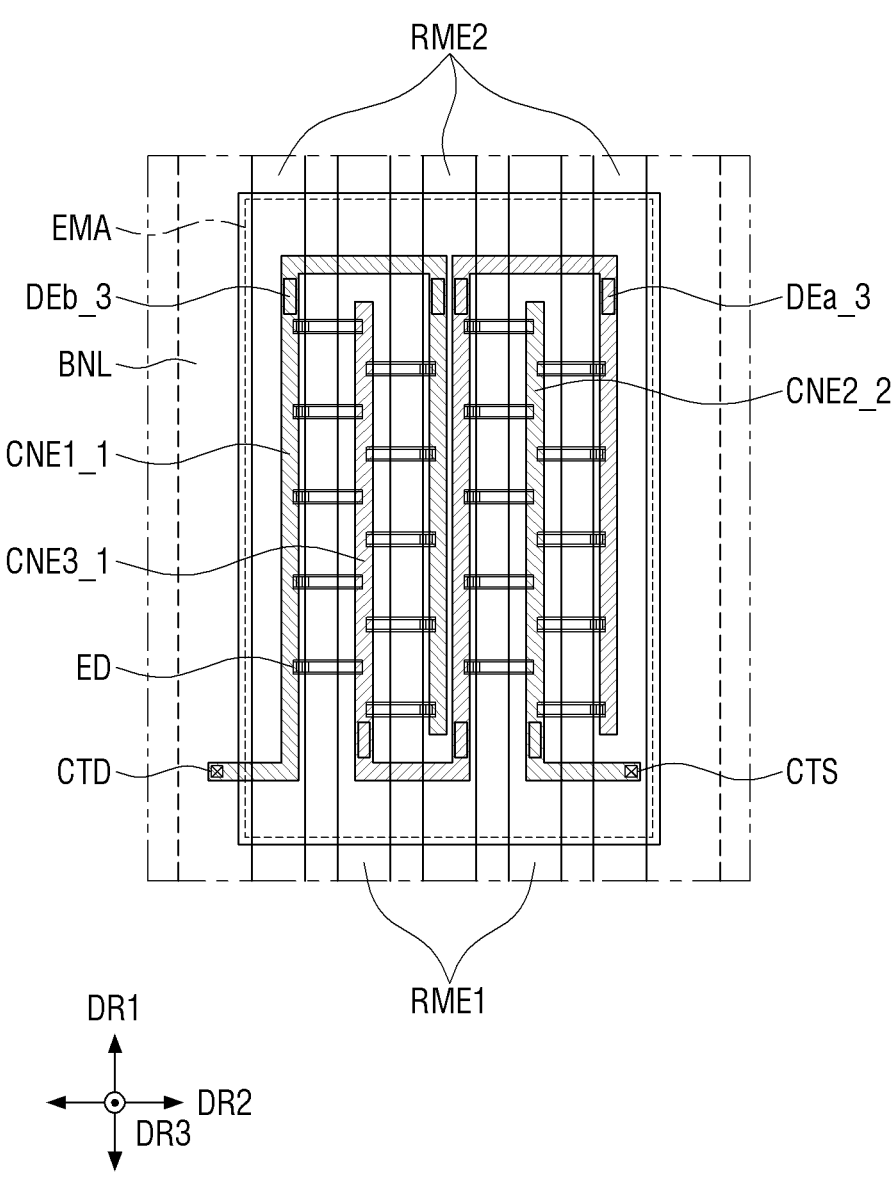
FIG. 25 is a plan view of a subpixel according to one or more embodiments.

FIG. 25 is a plan view of a subpixel according to one or more embodiments.

Referring to FIG. 25, a display device according to the current embodiment is different from the display device according to FIG. 23 in that a second connection electrode CNE2_2 includes only a $(2\text{-}1)^{th}$ extension portion and a $(2\text{-}2)^{th}$ extension portion, and a fourth connection electrode CNE4_1 is not included.

Dummy electrodes DEa_3 and DEb_3 may be respectively disposed at an end of a $(1\text{-}1)^{th}$ extension portion on the first side in the first direction DR1, an end of a $(1\text{-}3)^{th}$ extension portion on the first side in the first direction DR1, an end of the $(2\text{-}1)^{th}$ extension portion on the second side in the first direction DR1, an end of a $(3\text{-}1)^{th}$ extension portion on the second side in the first direction DR1, an end of a $(3\text{-}3)^{th}$ extension portion on the second side in the first direction DR1, an end of the $(3\text{-}3)^{th}$ extension portion on the first side in the first direction DR1, and an end of a $(3\text{-}5)^{th}$ extension portion on the first side in the first direction DR1.

Other elements and features have been described above with reference to FIG. 23, and thus a detailed description thereof will be omitted.

Figure 26:
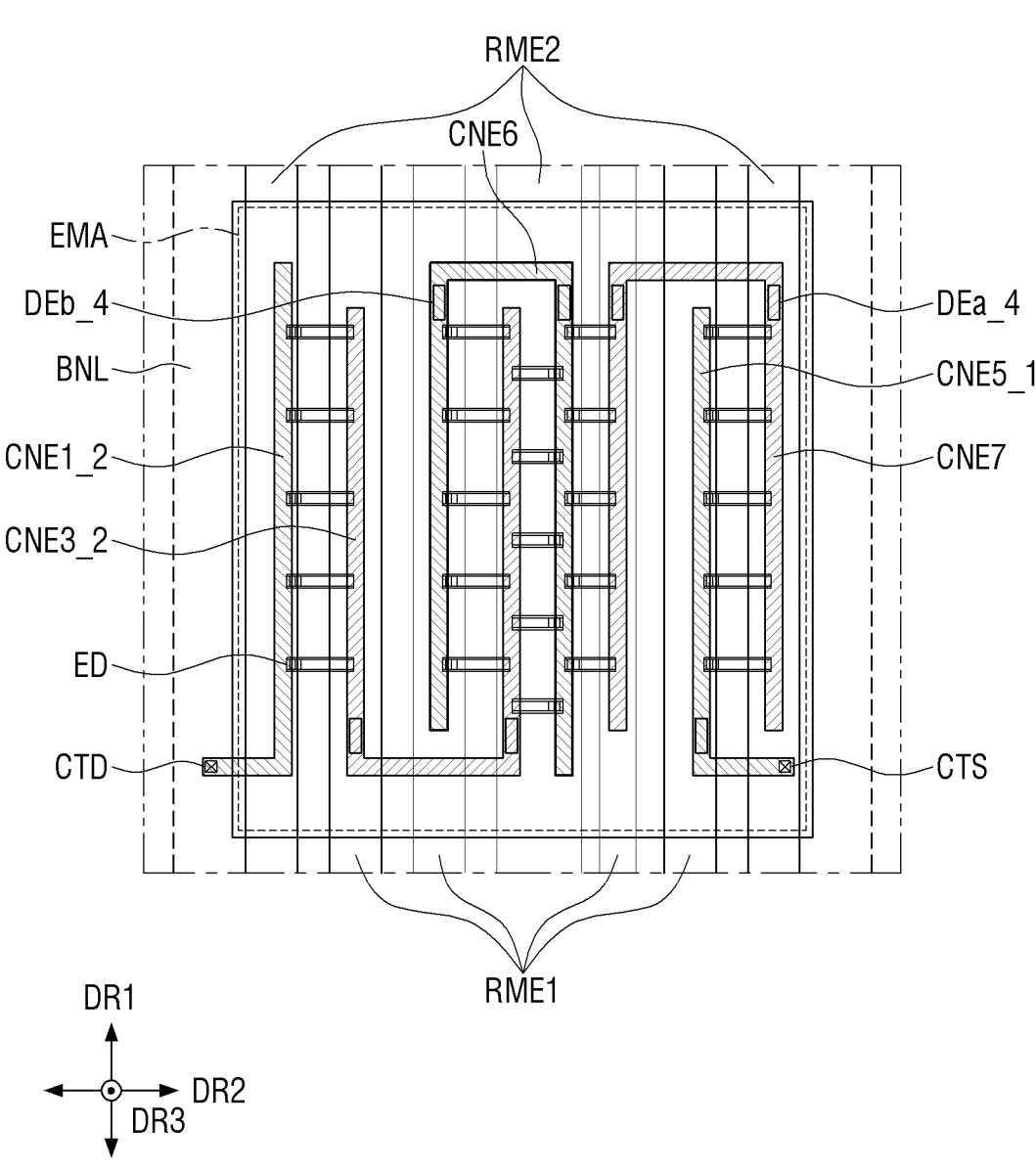
FIG. 26 is a plan view of a subpixel according to one or more embodiments.

FIG. 26 is a plan view of a subpixel according to one or more embodiments.

Referring to FIG. 26, a display device according to the current embodiment is different from the display devices according to FIGS. 24 and 25 in that a first connection electrode CNE1_2 includes only a $(1\text{-}1)^{th}$ extension portion, and a third connection electrode CNE3_2 includes only a $(3\text{-}1)^{th}$ extension portion, a $(3\text{-}2)^{th}$ extension portion, and a $(3\text{-}3)^{th}$ extension portion. More specifically, the display device according to the current embodiment may further include sixth and seventh connection electrodes CNE6 and CNE7. The sixth connection electrode CNE6 may include a $(6\text{-}1)^{th}$ extension portion extending along the first direction DR1, a $(6\text{-}2)^{th}$ extension portion bent in the second direction DR2 from the $(6\text{-}1)^{th}$ extension portion to extend along the second direction DR2, and a $(6\text{-}3)^{th}$ extension portion bent in the first direction DR1 from the $(6\text{-}2)^{th}$ extension portion to extend along the first direction DR1. The seventh connection electrode CNE7 may include a $(7\text{-}1)^{th}$ extension portion extending along the first direction DR1, a $(7\text{-}2)^{th}$ extension portion bent in the second direction DR2 from the $(7\text{-}1)^{th}$ extension portion to extend along the second direction DR2, and a $(7\text{-}3)^{th}$ extension portion bent in the first direction DR1 from the $(7\text{-}2)^{th}$ extension portion to extend along the first direction DR1.

The $(6\text{-}1)^{th}$ extension portion may overlap a first electrode RME1, the $(6\text{-}2)^{th}$ extension portion may overlap first and second electrodes RME1 and RME2, and the $(6\text{-}3)^{th}$ extension portion may overlap a second electrode RME2 overlapped by the $(3\text{-}3)^{th}$ extension portion. The $(7\text{-}1)^{th}$ extension portion may overlap a first electrode RME1, the $(7-2)^{th}$ extension portion may overlap first and second electrodes RME1 and RME2, and the $(7-3)^{th}$ extension portion may overlap a second electrode RME2.

The $(6-1)^{th}$ extension portion may be disposed between the $(3-1)^{th}$ extension portion and the $(3-3)^{th}$ extension portion in a plan view, and the $(6-3)^{th}$ extension portion may be disposed between the $(3-3)^{th}$ extension portion and the $(7-1)^{th}$ extension portion in a plan view. The $(7-1)^{th}$ extension portion may be disposed between the $(6-3)^{th}$ extension portion and a $(5-1)^{th}$ extension portion in a plan view.

Light emitting elements ED may be disposed between the $(1-1)^{th}$ extension portion and the $(3-1)^{th}$ extension portion, between the $(6-1)^{th}$ extension portion and the $(3-3)^{th}$ extension portion, between the $(3-3)^{th}$ extension portion and the $(6-3)^{th}$ extension portion, between the $(6-3)^{th}$ extension portion and the $(7-1)^{th}$ extension portion, and between the $(5-1)^{th}$ extension portion and the $(7-3)^{th}$ extension portion.

Dummy electrodes DEa_4 and DEb_4 may be disposed at an end of the $(3-1)^{th}$ extension portion on the second side in the first direction DR1, an end of the $(3-3)^{th}$ extension portion on the second side in the first direction DR1, an end of the $(6-1)^{th}$ extension portion on the first side in the first direction DR1, an end of the $(6-3)^{th}$ extension portion on the first side in the first direction DR1, an end of the $(7-1)^{th}$ extension portion on the first side in the first direction DR1, an end of the $(7-3)^{th}$ extension portion on the first side in the first direction DR1, and an end of the $(5-1)^{th}$ extension portion on the second side in the first direction DR1.

As described above, the connection electrodes CNE may be highly likely to be broken in an area where the above-described light emitting elements ED under a first connection conductive layer agglomerate and/or in an area where the above-described light emitting elements ED under a second connection conductive layer agglomerate. When a connection electrode CNE1_2, CNE3_2, CNE5_1, CNE6, or CNE7 is broken, the broken portion may be seen as a dark spot from the outside, which may cause a display defect of the display device.

However, also in the display device according to the current embodiment, a third insulating layer PAS3 (see FIG. 6) adopts a structure in which it includes insulating openings in which the dummy electrodes DEa_4 and DEb_4 are disposed, and the connection electrodes CNE1_2, CNE3_2, CNE5_1, CNE6, and CNE7 directly contact the dummy electrodes DEa_4 and DEb_4 in the insulating openings. In this structure, even if any one of the connection electrodes CNE1_2, CNE3_2, CNE5_1, CNE6, and CNE7 were broken, a dark spot may not be seen from the outside due to a dummy electrode DEa_4 or DEb_4 in direct contact with an upper surface or a lower surface of the connection electrode CNE1_2, CNE3_2, CNE5_1, CNE6, or CNE7. In addition, driving failure of the light emitting elements ED due to the breakage of the connection electrode CNE1_2, CNE3_2, CNE5_1, CNE6, or CNE7 can be prevented in advance.

FIG. 27 is a plan view of a subpixel according to one or more embodiments.

A display device according to one or more embodiments according to FIG. 27 is different from the display device according to FIG. 23 in that a third connection electrode CNE3_3 includes only $(3-1)^{th}$ through $(3-3)^{th}$ extension portions and further includes a branch portion extending from the $(3-2)^{th}$ extension portion toward the second side in the first direction DR1, and a $(6-3)^{th}$ extension portion of a sixth connection electrode CNE6_1 is connected to an electrode contact hole CTD. The branch portion may be connected to an electrode contact hole CTS.

A $(6-1)^{th}$ extension portion may overlap a second electrode RME2 overlapped by a $(1-3)^{th}$ extension portion, and each of the $(3-1)^{th}$ extension portion and the $(3-3)^{th}$ extension portion may overlap a first electrode RME1.

Light emitting elements ED may be disposed between a $(1-1)^{th}$ extension portion and the $(3-1)^{th}$ extension portion, between the $(3-1)^{th}$ extension portion and the $(1-3)^{th}$ extension portion, between the $(6-1)^{th}$ extension portion and the $(3-3)^{th}$ extension portion, and between the $(3-3)^{th}$ extension portion and the $(6-3)^{th}$ extension portion.

Dummy electrodes DEa_5 and DEb_5 may be disposed at an end of the $(1-3)^{th}$ extension portion on the first side in the first direction DR1, an end of the $(3-1)^{th}$ extension portion on the second side in the first direction DR1, an end of the $(3-3)^{th}$ extension portion on the second side in the first direction DR1, and an end of the $(6-3)^{th}$ extension portion on the first side in the first direction DR1.

As described above, the connection electrodes CNE may be highly likely to be broken in an area where the above-described light emitting elements ED under a first connection conductive layer agglomerate and/or in an area where the above-described light emitting elements ED under a second connection conductive layer agglomerate. When a connection electrode CNE1_1, CNE3_3, or CNE6_1 were broken, the broken portion may not be seen as a dark spot from the outside, which may cause a display defect of the display device.

However, also in the display device according to the current embodiment, a third insulating layer PAS3 (see FIG. 6) adopts a structure in which it includes insulating openings in which the dummy electrodes DEa_5 and DEb_5 are disposed, and the connection electrodes CNE1_1, CNE3_3, and CNE6_1 directly contact the dummy electrodes DEa_5 and DEb_5 in the insulating openings. In this structure, even if any one of the connection electrodes CNE1_1, CNE3_3, and CNE6_1 were broken, a dark spot may not be seen from the outside due to a dummy electrode DEa_5 or DEb_5 in direct contact with an upper surface or a lower surface of the connection electrode CNE1_1, CNE3_3, or CNE6_1. In addition, driving failure of the light emitting elements ED due to the breakage of the connection electrode CNE1_1, CNE3_3, or CNE6_1 can be prevented in advance.

FIG. 28 is a plan view of a subpixel according to one or more embodiments.

Referring to FIG. 28, a display device according to the current embodiment is different from the display device according to FIG. 27 in that a $(3-2)^{th}$ extension portion of a third connection electrode CNE3_3 extends in the second direction DR2 from an end of a $(3-1)^{th}$ extension portion on the first side in the first direction DR1 and is connected to an end of a $(3-3)^{th}$ extension portion on the first side in the first direction DR1, and an eighth connection electrode CNE8 is further included.

The seventh connection electrode CNE7 of FIG. 26 may be applied to a seventh connection electrode CNE7_1. A $(7-1)^{th}$ extension portion may overlap a first electrode RME1, a $(7-2)^{th}$ extension portion may overlap first and second electrodes RME1 and RME2, and a $(7-3)^{th}$ extension portion may overlap a second electrode RME2. The eighth connection electrode CNE8 may include an $(8-1)^{th}$ extension portion extending along the first direction DR1, an $(8-2)^{th}$ extension portion bent in the second direction DR2 from the $(8-1)^{th}$ extension portion to extend in the second direction DR2, and an $(8-3)^{th}$ extension portion bent in the first direction DR1 from the $(8-2)^{th}$ extension portion to extend in the first direction DR1. The $(8-3)^{th}$ extension portion may extend further toward the second side in the first direction DR1 beyond the $(8-2)^{th}$ extension portion, and a portion of the $(8-3)^{th}$ extension portion that extends further toward the second side in the first direction DR1 beyond the $(8-2)^{th}$ extension portion may be connected to an electrode contact hole CTS.

The $(3-1)^{th}$ extension portion may be disposed between a $(1-1)^{th}$ extension portion and the $(8-1)^{th}$ extension portion, the $(3-3)^{th}$ extension portion may be disposed between the $(8-1)^{th}$ extension portion and a $(1-3)^{th}$ extension portion, the $(8-1)^{th}$ extension portion may be disposed between the $(3-1)^{th}$ extension portion and the $(3-3)^{th}$ extension portion, the $(8-3)^{th}$ extension portion may be disposed between the $(7-1)^{th}$ extension portion and the $(7-3)^{th}$ extension portion, and the $(7-1)^{th}$ extension portion may be disposed between the $(1-3)^{th}$ extension portion and the $(8-3)^{th}$ extension portion.

The $(3-3)^{th}$ extension portion and the $(1-3)^{th}$ extension portion may overlap the same second electrode RME2, the $(3-1)^{th}$ extension portion and the $(8-1)^{th}$ extension portion may overlap the same first electrode RME1, and the $(7-1)^{th}$ extension portion and the $(8-3)^{th}$ extension portion may overlap the same first electrode RME1.

Light emitting elements ED may be disposed between the $(1-1)^{th}$ extension portion and the $(3-1)^{th}$ extension portion, between the $(8-1)^{th}$ extension portion and the $(3-3)^{th}$ extension portion, between the $(1-3)^{th}$ extension portion and the $(7-1)^{th}$ extension portion, and between the $(8-3)^{th}$ extension portion and the $(7-3)^{th}$ extension portion.

Dummy electrodes DEa_6 and DEb_6 may be disposed at an end of the $(1-1)^{th}$ extension portion on the first side in the first direction DR1, an end of the $(3-1)^{th}$ extension portion on the first side in the first direction DR1, an end of the $(3-3)^{th}$ extension portion on the first side in the first direction DR1, an end of the $(1-3)^{th}$ extension portion on the first side in the first direction DR1, an end of the $(7-1)^{th}$ extension portion on the first side in the first direction DR1, and an end of the $(7-3)^{th}$ extension portion on the first side in the first direction DR1.

As described above, the connection electrodes CNE may be highly likely to be broken in an area where the above-described light emitting elements ED under the first connection conductive layer agglomerate and/or in an area where the above-described light emitting elements ED under the second connection conductive layer agglomerate. When a connection electrode CNE1_1, CNE3_3, CNE7_1, or CNE8 is broken, the broken portion may be seen as a dark spot from the outside, which may cause a display defect of the display device.

However, also in the display device according to the current embodiment, a third insulating layer PAS3 (see FIG. 6) adopts a structure in which it includes insulating openings in which the dummy electrodes DEa_6 and DEb_6 are disposed, and the connection electrodes CNE1_1, CNE3_3, CNE7_1, and CNE8 directly contact the dummy electrodes DEa_6 and DEb_6 in the insulating openings. In this structure, even if any one of the connection electrodes CNE1_1, CNE3_3, CNE7_1, and CNE8 were broken, a dark spot may not be seen from the outside due to a dummy electrode DEa_6 or DEb_6 in direct contact with an upper surface or a lower surface of the connection electrode CNE1_1, CNE3_3, CNE7_1, or CNE8. In addition, driving failure of the light emitting elements ED due to the breakage of the connection electrode CNE1_1, CNE3_3, CNE7_1, or CNE8 can be prevented in advance.

It should be understood, however, that the aspects and features of embodiments of the present disclosure are not restricted to the one set forth herein. The above and other aspects of the present disclosure will become more apparent to one of ordinary skill in the art to which the present disclosure pertains by referencing the claims, with functional equivalents thereof to be included therein.

What is claimed is:

1. A display device comprising:
   a substrate;
   a first electrode and a second electrode on the substrate, extending parallel to each other along a first direction, and spaced from each other in a second direction intersecting the first direction;
   a plurality of light emitting elements on the first electrode and the second electrode;
   a first insulating layer partially covering upper surfaces of the plurality of light emitting elements;
   a first connection electrode on the plurality of light emitting elements and the first insulating layer, the first connection electrode being in contact with an end of each of the plurality of light emitting elements;
   a second insulating layer on the first connection electrode;
   a second connection electrode on the second insulating layer, the second connection electrode being in contact with an other end of each of the plurality of light emitting elements; and
   a first dummy electrode overlapping the first connection electrode in a thickness direction of the substrate.

2. The display device of claim 1, wherein the first dummy electrode is at a same layer as the second connection electrode and comprises a same material as the second connection electrode.

3. The display device of claim 2, wherein the second insulating layer comprises a first insulating hole partially exposing an upper surface of the first connection electrode, and the first dummy electrode is in direct contact with the upper surface of the first connection electrode through the first insulating hole.

4. The display device of claim 3, wherein the first dummy electrode is electrically insulated from the second connection electrode.

5. The display device of claim 4, wherein the first dummy electrode overlaps the plurality of light emitting elements in the thickness direction of the substrate.

6. The display device of claim 4, wherein the first dummy electrode is located at an end of the first connection electrode on a first side in the first direction.

7. The display device of claim 1, wherein the first connection electrode overlaps the first electrode in the thickness direction of the substrate, and the second connection electrode overlaps the second electrode in the thickness direction of the substrate.

8. The display device of claim 3, wherein the second connection electrode extends toward a second side in the first direction.

9. The display device of claim 8, further comprising a third connection electrode at a same layer as the first connection electrode and spaced, in the second direction, from a portion of the second connection electrode that extends toward the second side in the first direction.

10. The display device of claim 9, wherein the portion of the second connection electrode that extends toward the second side in the first direction and the third connection electrode is in contact with the ends of the plurality of light emitting elements.

11. The display device of claim 10, further comprising a second dummy electrode overlapping, in the thickness direction of the substrate, the portion of the second connection electrode that extends toward the second side in the first direction.

12. The display device of claim 11, wherein the second dummy electrode is at the same layer as the first connection electrode, and the second dummy electrode comprises a same material as the first connection electrode.

13. The display device of claim 12, wherein the second dummy electrode is between the first connection electrode and the third connection electrode in a plan view.

14. A method of manufacturing a display device, the method comprising:

forming a first electrode and a second electrode on a substrate, the first electrode and the second electrode extending parallel to each other along a first direction and spaced from each other in a second direction intersecting the first direction;

forming a plurality of light emitting elements on the first electrode and the second electrode;

forming a first insulating layer partially covering upper surfaces of the plurality of light emitting elements;

forming a first connection electrode on the plurality of light emitting elements and the first insulating layer, the first connection electrode contacting an end of each of the plurality of light emitting elements;

forming a second insulating layer on the first connection electrode; and forming a second connection electrode on the second insulating layer, the second connection electrode contacting an other end of each of the plurality of light emitting elements, wherein in the forming of the second connection electrode, a first dummy electrode overlapping the first connection electrode in a thickness direction of the substrate is also formed.

15. The method of claim 14, wherein the first dummy electrode is at a same layer as the second connection electrode and comprises a same material as the second connection electrode.

16. The method of claim 15, wherein in the forming of the second insulating layer, the second insulating layer comprises a first insulating hole partially exposing an upper surface of the first connection electrode, and the first dummy electrode is in direct contact with the upper surface of the first connection electrode through the first insulating hole.

17. The method of claim 16, wherein the second connection electrode extends toward a second side in the first direction in the forming of the second connection electrode, and a third connection electrode at a same layer as the first connection electrode and spaced, in the second direction, from a portion of the second connection electrode that extends toward the second side in the first direction is formed in the forming of the first connection electrode.

18. The method of claim 17, wherein the portion of the second connection electrode that extends toward the second side in the first direction and the third connection electrode is in contact with the ends of the plurality of light emitting elements.

19. The method of claim 18, wherein in the forming of the first connection electrode, a second dummy electrode overlapping, in the thickness direction of the substrate, the portion of the second connection electrode that extends toward the second side in the first direction and located at a same layer as the first connection electrode is formed.

20. The method of claim 19, wherein the second dummy electrode is formed between the first connection electrode and the third connection electrode in a plan view.

* * * * *